United States Patent
Tsao

(10) Patent No.: US 6,496,415 B2
(45) Date of Patent: Dec. 17, 2002

(54) NON-VOLATILE MEMORY DEVICE HAVING HIGH SPEED PAGE MODE OPERATION

(75) Inventor: Cheng-Chung Tsao, Hsinchu (TW)

(73) Assignee: Integrated Memory Technologies, Inc., Santa Clara, CA (US)

( * ) Notice: Subject to any disclaimer, the term of this patent is extended or adjusted under 35 U.S.C. 154(b) by 0 days.

(21) Appl. No.: 09/996,234

(22) Filed: Nov. 27, 2001

(65) Prior Publication Data

US 2002/0145908 A1 Oct. 10, 2002

Related U.S. Application Data

(62) Division of application No. 09/827,467, filed on Apr. 6, 2001, now Pat. No. 6,377,507.

(51) Int. Cl.$^7$ .............................................. G11C 16/04
(52) U.S. Cl. ............................... 365/185.12; 365/185.11
(58) Field of Search .................... 365/185.12, 230.03, 365/230.06, 185.11, 185.14, 185.28, 185.23, 189.02

(56) References Cited

U.S. PATENT DOCUMENTS

| | | | | |
|---|---|---|---|---|
| 5,535,167 A | * | 7/1996 | Hazani | 365/218 |
| 5,625,590 A | * | 4/1997 | Choi et al. | 365/185.11 |
| 5,963,475 A | * | 10/1999 | Choi et al. | 365/185.11 |
| 6,363,013 B1 | * | 3/2002 | Lu et al. | 365/185.18 |

* cited by examiner

Primary Examiner—Michael S. Lebentritt
Assistant Examiner—Anh Phung

(74) Attorney, Agent, or Firm—Gray Cary Ware & Freidenrich LLP

(57) ABSTRACT

A nonvolatile semiconductor memory includes a plurality of memory cells arranged in columns and rows, a plurality of word lines, a plurality of bit lines, a plurality of output buffers, a plurality of page latches 18L, and a plurality of Quick Current Level Translators (QCLT). Each QCLT is connected to and is shared by a plurality of bit lines (32 in the preferred embodiment) through a first column decoder 44/46U and is also connected to a plurality of page latches through a second column decoder 46L. Each page latch is connected to one corresponding output buffer through a third column decoder circuit 38/40/42. The page latches are grouped in a plurality of sub-pages. The QCLT performs high speed and high accuracy current-mode comparison and converts the result of comparison into binary codes. These codes are stored in Q-latches 36U-2. The QCLT functions as a current-mode analog-to-digital converter (ADC) which converts the memory cell current to binary codes. The data latched in Q-latches will be transferred to page latches 34 for reading out. The cell current sensing devices (QCLT) are separated from the data storage devices (page latches). Hence, the QCLT can perform current sensing operation while the page latch data are being clocked out simultaneously. Within the pitch of 32 bit lines, the QCLT can be designed to achieve high speed sensing, while each page latch has a pitch of 2 bit lines, and shared by two columns of memory cells. High speed sensing makes QCLT more appealing to multi-level cell products. Since multiple sensing iterations are required to determine which levels the cell current located between. Higher speed means less waiting time.

8 Claims, 38 Drawing Sheets

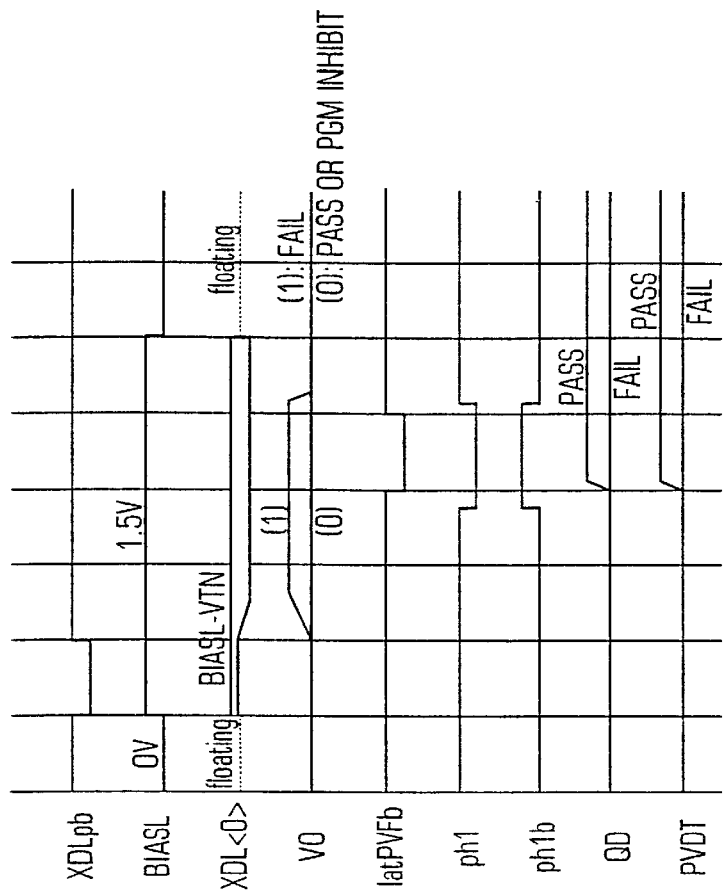

TIMING DIAGRAM FOR PGM

CURRENT COMPARATOR

|  | QDH | QDL |
|---|---|---|
| lat11 & (VTH<VCR1) | 1 | 1 |
| lat10 & (VTH<VCR2) | 1 | 0 |
| lat01 & (VTH<VCR3) | 0 | 1 |
| RESET | 0 | 0 |

QUICK CURRENT LEVEL TRANSLATOR (QCLT)

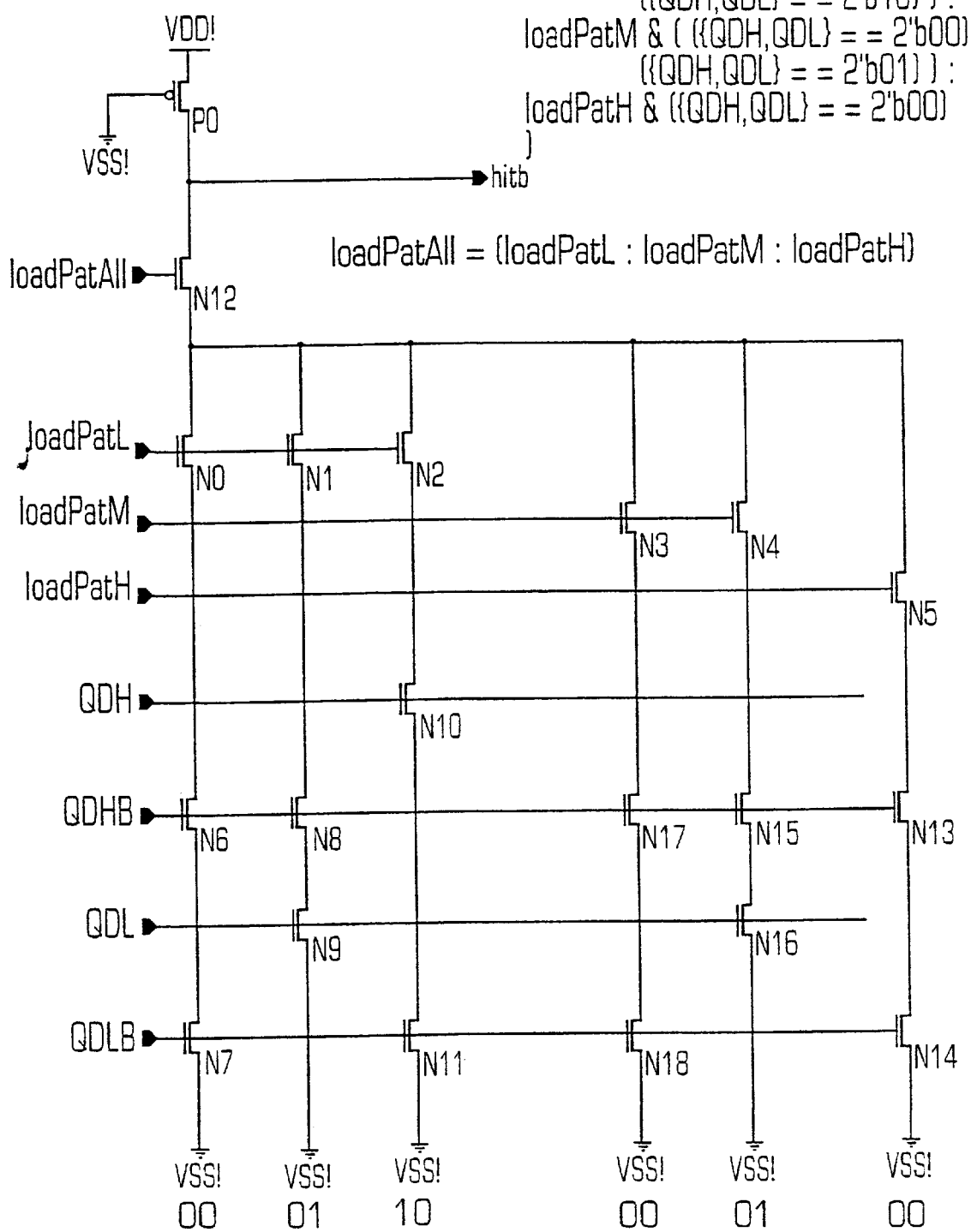
FIG. 10B  PATTERN RECOGNITION ROM (PTR)

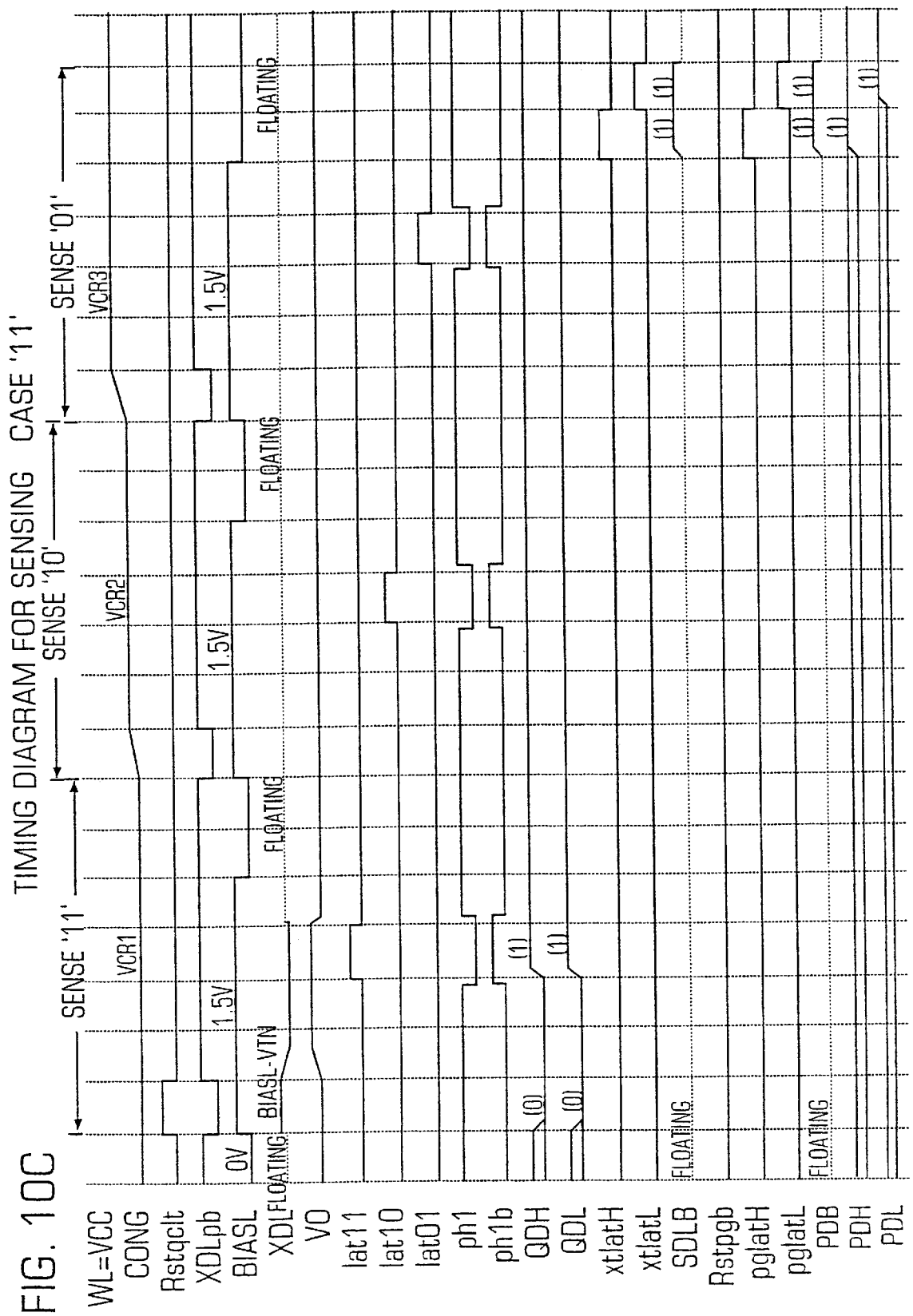

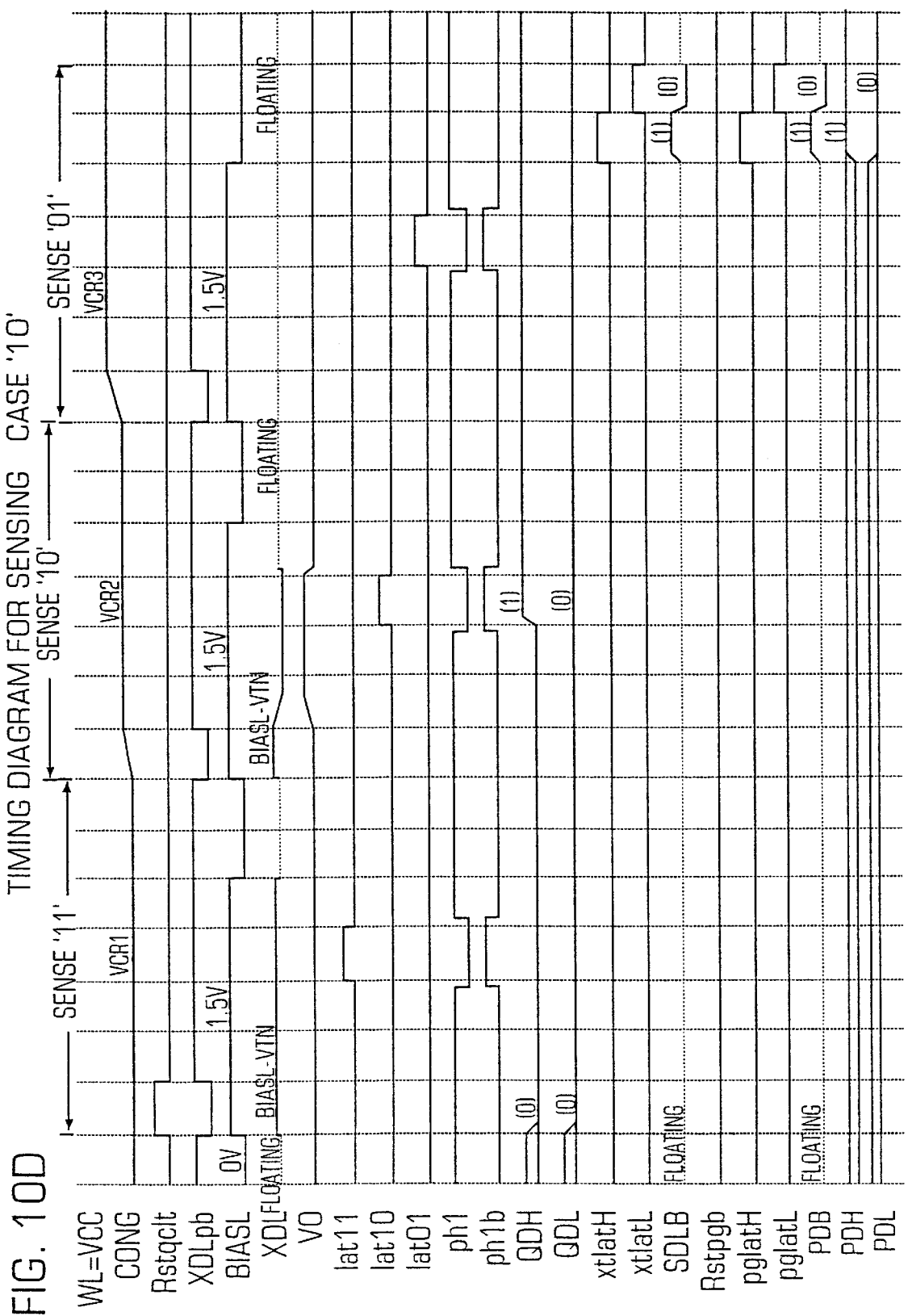
FIG. 10D  TIMING DIAGRAM FOR SENSING CASE '10'

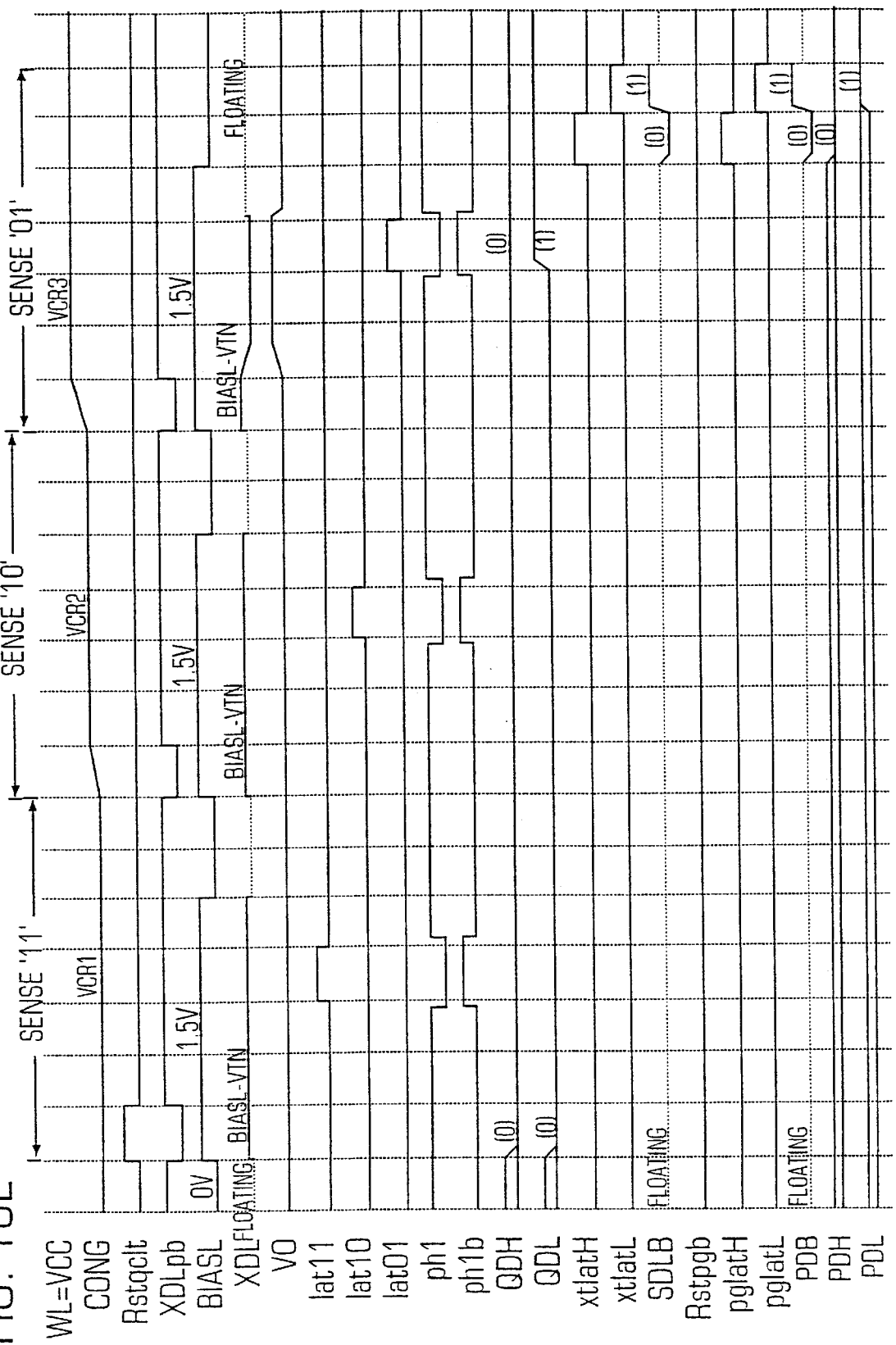
FIG. 10E TIMING DIAGRAM FOR SENSING CASE '01'

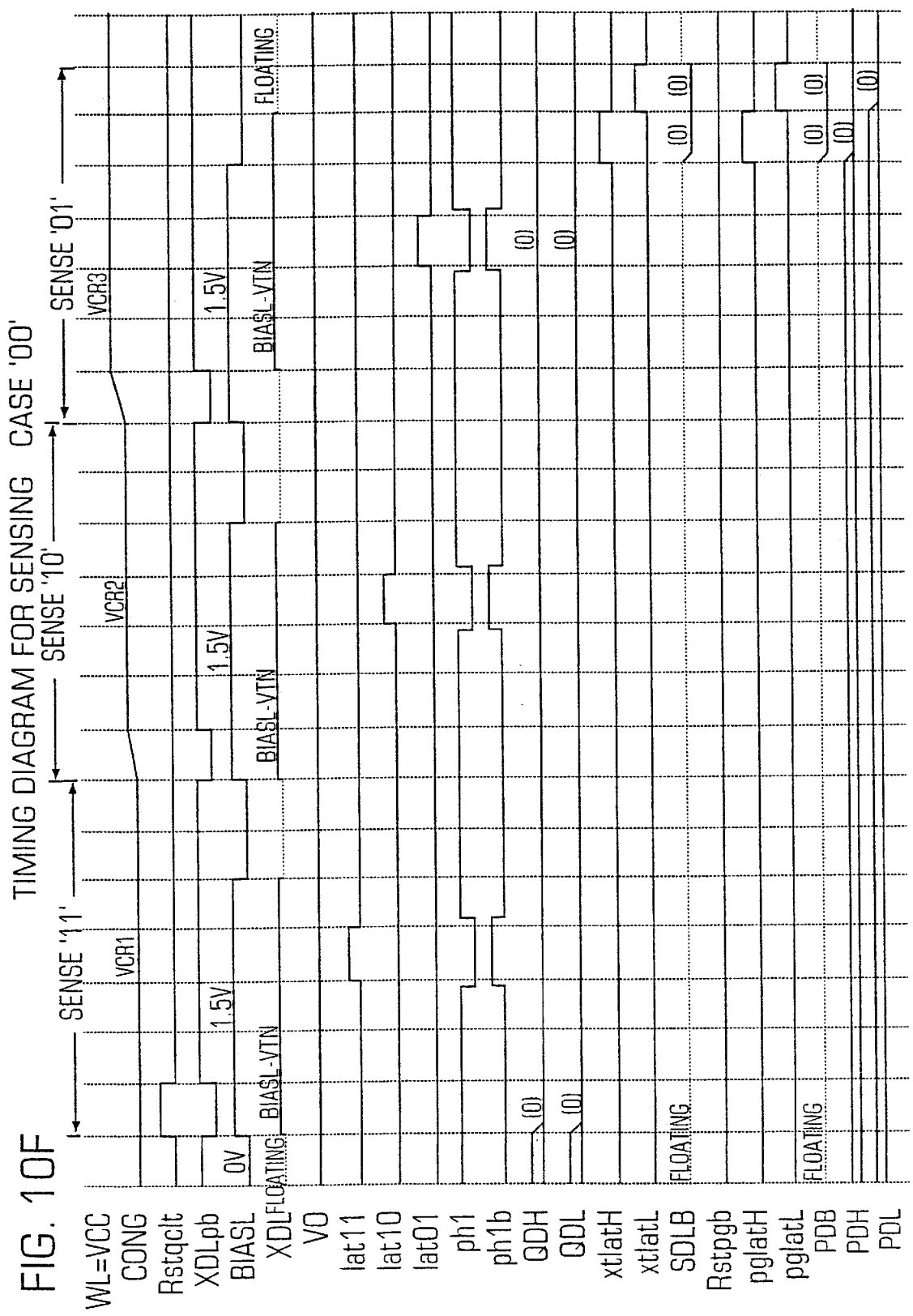
FIG. 10F TIMING DIAGRAM FOR SENSING CASE '00'

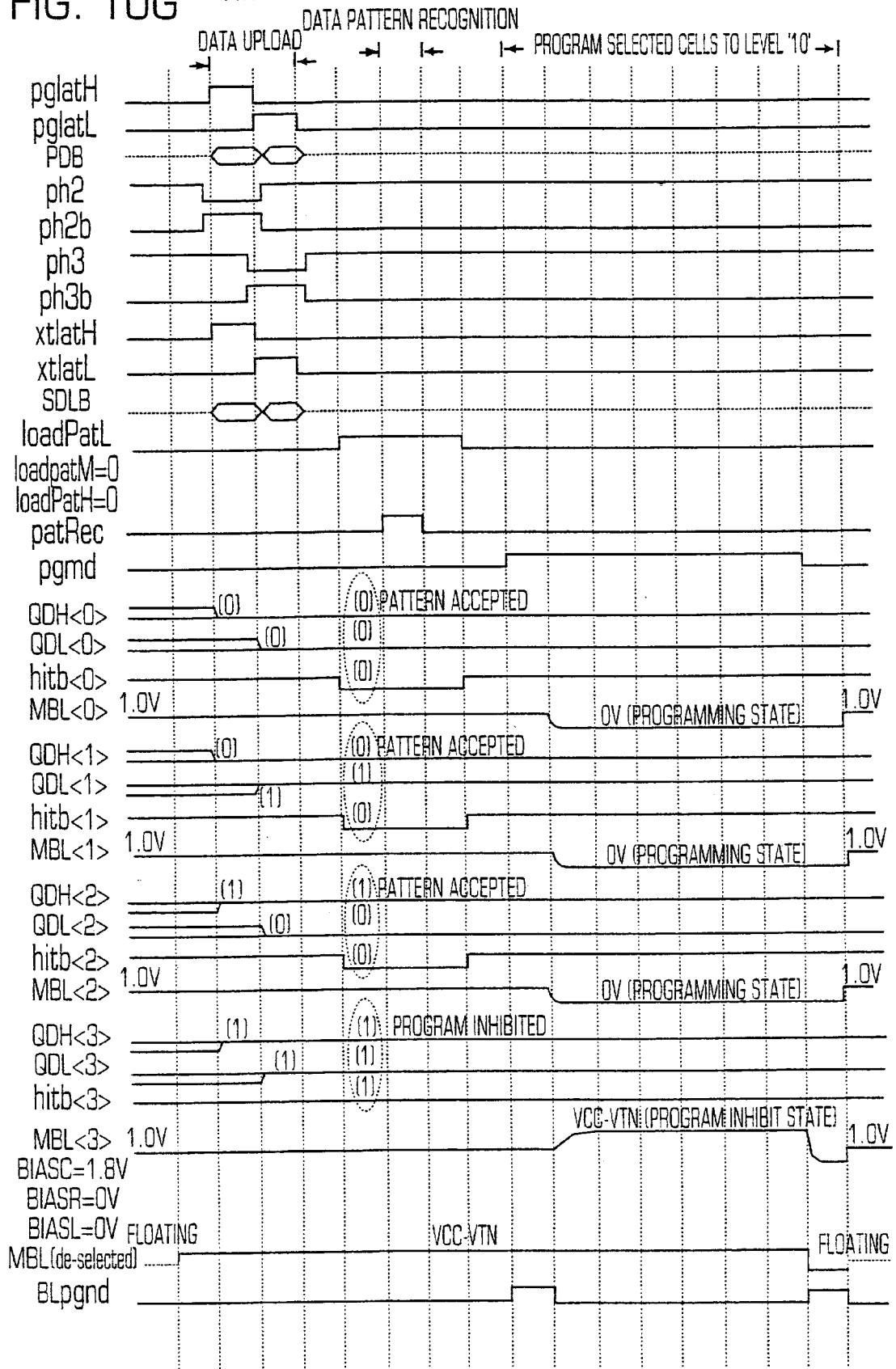

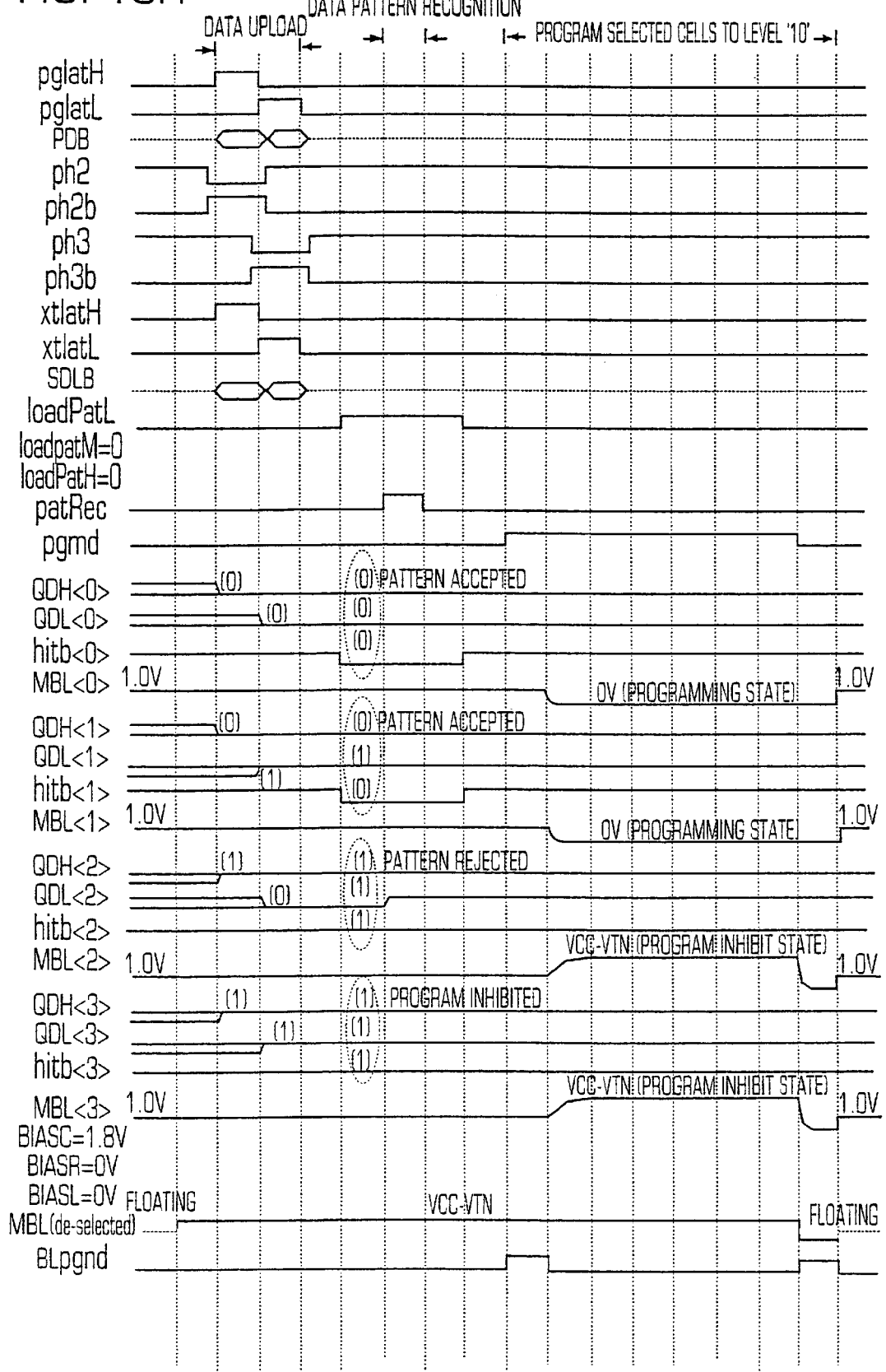
FIG. 10H TIMING DIAGRAM FOR PGM LEVEL '01'

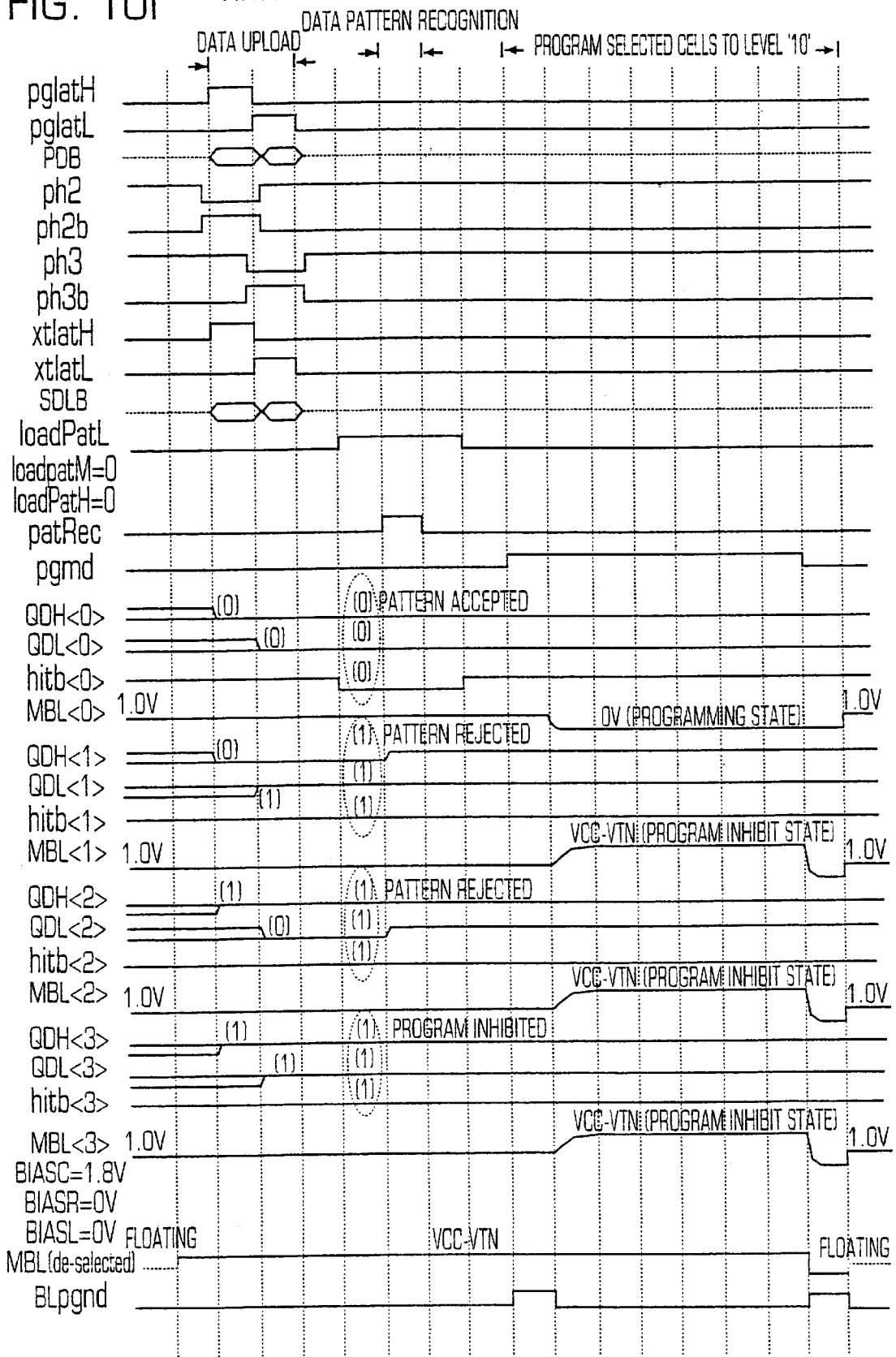
FIG. 101 TIMING DIAGRAM FOR PGM LEVEL '00'

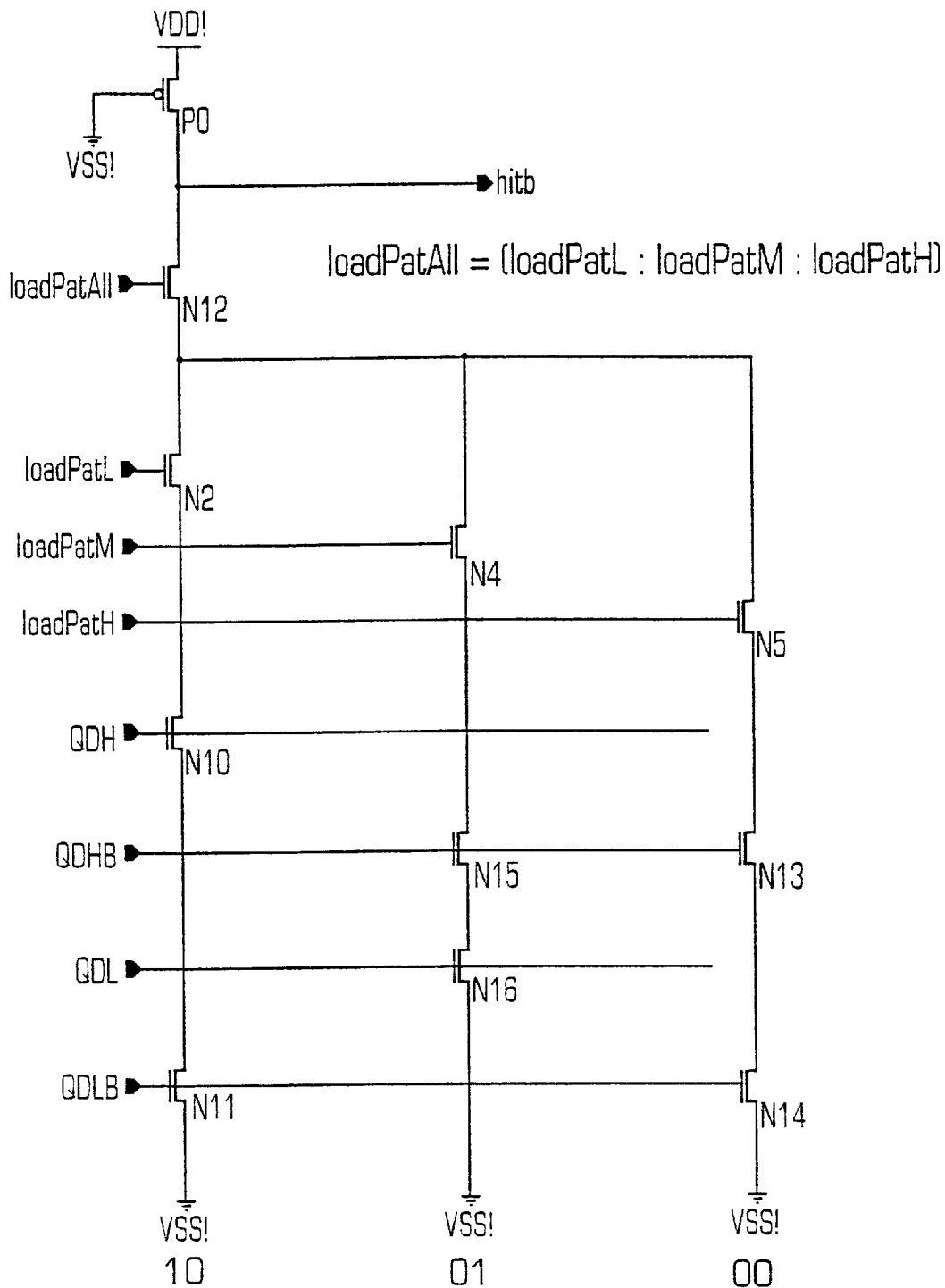
FIG. 11B — PATTERN RECOGNITION ROM (PTR)
hitb = !(loadPatL & ( ({QDH,QDL} == 2'b10) :
  loadPatM & ( ({QDH,QDL} == 2'b01) :
  loadPatH & ({QDH,QDL} == 2'b00) )
loadPatAll = (loadPatL : loadPatM : loadPatH)

NON-VOLATILE MEMORY DEVICE HAVING HIGH SPEED PAGE MODE OPERATION

This is a divisional application of application Ser. No. 09/827,469 filed on Apr. 6, 2001, now U.S. Pat. No. 6,377,507 issued on Apr. 23, 2002.

BACKGROUND OF THE INVENTION

1. Field of the Invention

The present invention relates to an improved non-volatile integrated circuit memory device with separate sense and store circuits to achieve high speed page mode operations, such as read or program.

2. Description of the Prior Art

Semiconductor integrated memory circuit devices for storing data typically have been categorized as either volatile, in which the data is lost once the power is turned off, or non-volatile, in which the data is retained even after the power is turned off.

Non-volatile memories, comprising an array of non-volatile memory cells arranged in a plurality of rows and columns (or bit lines), can be categorized as either NAND or NOR type, referring to the manner in which the non-volatile memory cells are arranged in the array. Further, the non-volatile memory cells can be arranged to operate in a page mode manner, in which a page of data (typically 512 bytes) is stored in a plurality of latches (or plurality of page buffers) that are integrated with the memory circuit device. Reading of the integrated memory circuit device causes data from a page of the memory cells to be read and stored in the plurality of latches. Thereafter the contents of the plurality of latches are read, typically, in a serial manner, from the integrated memory circuit device. Programming of the integrated memory circuit device causes data from the external to be stored in the plurality of latches. Thereafter, the contents of the plurality of latches are stored in a page of non-volatile memory cells. Typically a page of non-volatile memory cells lie in the same row or word line.

In a conventional page-mode read operation, whenever a word line is addressed, a wait state is necessary for the on-chip control circuits to sense out data stored in the memory cells of that selected word line. After being sensed out, the data is latched into the plurality of page buffers before they are clocked out to the I/O pads. This wait-state, typically around several micro-seconds, accounts for a significant portion of the average page-mode read access time. Especially in applications of reading large volume data, several consecutive word lines are often addressed successively. With one wait-state for each addressed word line, the overall read performance is deteriorated. Therefore, a non-volatile memory with minimized number of wait-states is needed to provide high performance page-mode read operation.

In the prior art, one of the factors causing the wait state is due to the sensing circuit and the latching circuit being provided together for sensing and latching the contents of memory cells along a bit line or a group of bit lines. Thus, the pitch attendant to each sensing circuit and accompanying latch circuit must be the same and must be small to accommodate the pitch of the corresponding bit line or group of bit lines.

In U.S. Pat. No. 5,768,215 a proposed solution to the aforementioned problem of the wait state is to provide two groups of page buffers, with each group of page buffers being one half the size of a page of memory cells. Initially, the data from a first page of memory cells is read into the two groups of page buffers. Thereafter, a first group of page buffers is read and the contents outputted to the external. However, as soon as the reading of the contents of the second group of page buffers commences, the reading of a second page of memory cells commences with the data read from one half of the second page of memory cells being stored in the first group of page buffers. After the contents of the second group of page buffers is outputted to the external, one half of the second page of memory cells will also have been read and stored in the first group of page buffers. As the reading of the first group of page buffers commences, the reading of the second half of the second page of memory cells commences and is stored in the second group of page buffers. This alternation of reading one half of a page of memory cells and storing the data into one of the groups of page buffers, while the contents of the other group of page buffers is read out continues. While this technique can avoid a certain amount of the wait time, it does not eliminate all.

In a conventional page-mode program operation, data is first loaded into the plurality of page buffers sequentially. Regardless of the number of bits (or collective bytes) to be programmed, all the data loaded into the plurality of page buffers will be programmed into the memory cells of a selected page simultaneously. Since the on-chip circuits, such as the charge pump (because typically programming requires a voltage source higher than the externally supplied voltage) can deliver only a limited amount of current, the efficiency of programming will deteriorate as the number of bits increases. Because of the limitation in the amount of current that can be provided by the on-board charge pump, one solution is to require a larger amount of time to program a page (or more) of data. Therefore a new technique is needed to provide high efficiency programming.

Non-volatile memory cells used in NAND architecture are typically of the stack gate type, such as that disclosed in U.S. Pat. No. 5,768,215. Further, the non-volatile memory cells used in NOR architecture can be both the stack gate type or the split gate type such as that disclosed in U.S. Pat. No. 5,668,757, whose disclosure is incorporated by reference in its entirety.

Finally, in the prior art, a combination sense amplifier and latch has been used to sense the content of the non-volatile memory cell, with the latch used to store the content from the sense amplifier or from the external, in a page mode operation. This, however, necessitates the combination sense amplifier/latch to have a pitch which is consistent with the pitch of the memory cells, which is a compromise in the performance of the sense amplifier.

SUMMARY OF THE INVENTION

It is an object of the present work to provide a nonvolatile semiconductor memory capable of performing high-speed page-mode read and program operation.

It is another object of the present work to provide a multi-level nonvolatile semiconductor memory product capable of performing high-spped page-mode read and program operation.

To achieve objects of the present work, a quick current level translator (QCLT) is designed to work with the conventional page latch. Each QCLT is a current-mode analog-to-digital converter (ADC) designed to detect the cell current and to convert it to binary codes. The codes are temporarily stored in Q-latches of QCLT and then transferred to page latches for clocking out. Each QCLT is shared among 32 bit lines. This results in a large pitch width which results in a high speed ADC. Furthermore, the QCLT could also be modified for multi-level cell current sensing. Since QCLT is a current-mode ADC, it could be used to resolve the cell current of a multi-level cell. Cell current will be converted to binary codes according to its signal magnitude.

The present invention is also capable of performing gapless read.

BRIEF DESCRIPTION OF THE DRAWINGS

FIG. 4A is a detailed circuit diagram of one of the page buffers shown in FIG. 3.

FIG. 4D is a timing diagram showing page-mode program verification operation for the device of the present invention.

FIG. 10B is a detailed circuit diagram of a pattern-recognition ROM circuit use in the sensing circuit shown in FIG. 10.

FIG. 10C is a timing diagram showing page-mode read operation for a multi-level cell programmed to the condition of "11" for the device of the present invention.

FIG. 10D is a timing diagram showing page-mode read operation for a multi-level cell programmed to the condition of "10" for the device of the present invention.

FIG. 10E is a timing diagram showing page-mode read operation for a multi-level cell programmed to the condition of "01" for the device of the present invention.

FIG. 10F is a timing diagram showing page-mode read operation for a multi-level cell programmed to the condition of "00" for the device of the present invention.

FIG. 10G is a timing diagram showing page-mode program operation for a multi-level cell to be programmed to the condition of "10" for the device of the present invention.

FIG. 10H is a timing diagram showing page-mode program operation for a multi-level cell to be programmed to the condition of "01" for the device of the present invention.

FIG. 10I is a timing diagram showing page-mode program operation for a multi-level cell to be programmed to the condition of "00" for the device of the present invention.

FIG. 11B is a schematic circuit diagram of another pattern-recognition ROM circuit use in the sensing circuit shown in FIG. 10.

DETAILED DESCRIPTION OF THE PREFERRED EMBODIMENT

Figure 1:
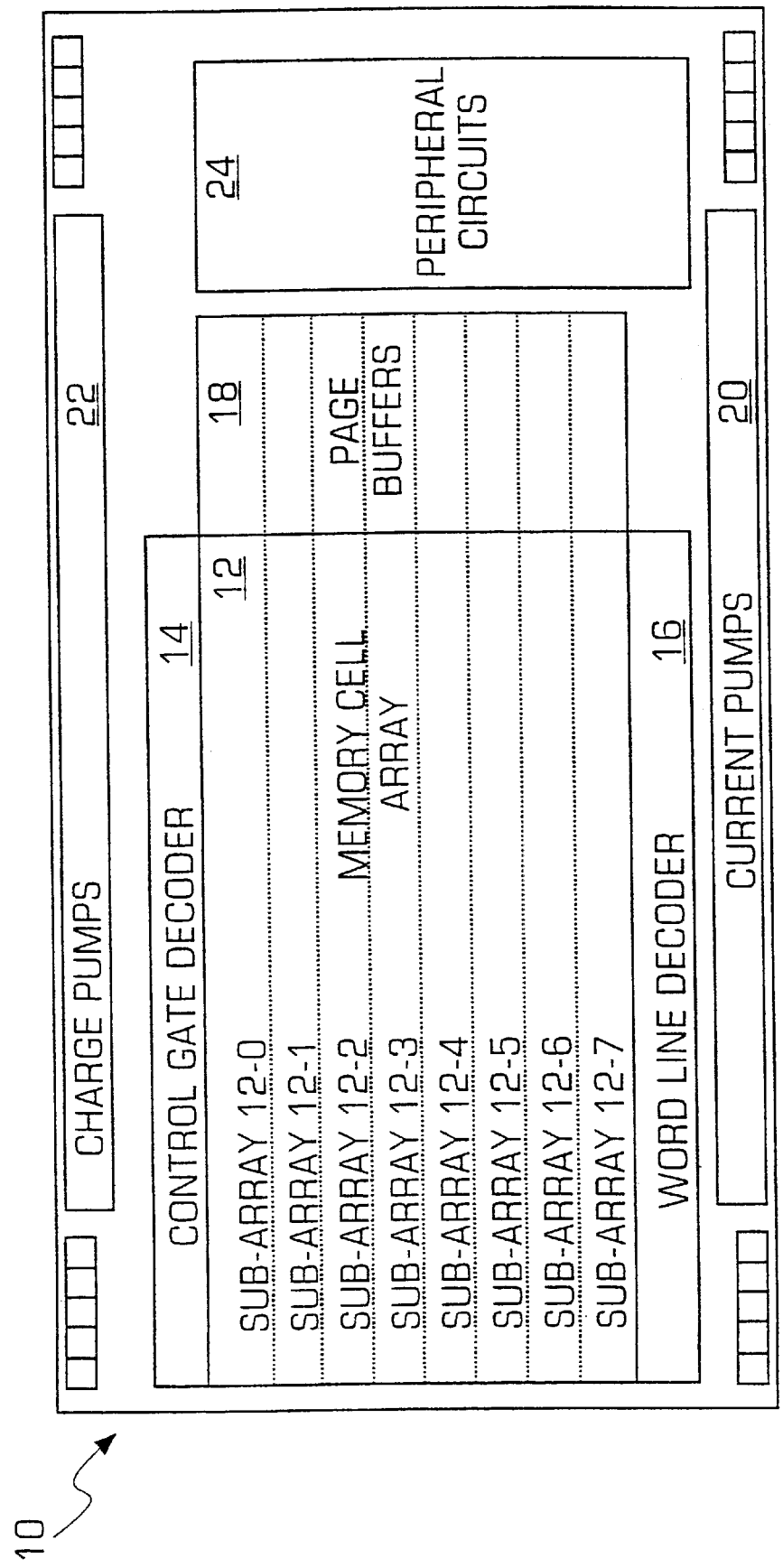
FIG. 1 is a schematic layout of a floor plan of an integrated memory circuit device of the present invention.

Referring to FIG. 1 there is shown a schematic layout of a floor plan for an integrated memory circuit device 10 of the present invention. As is well known, the device 10 is fabricated from silicon and is an integrated circuit device or a chip 10. In the preferred embodiment, the device or chip 10 is an 8M×8-bit flash EEPROM, using non-volatile memory cells of the split gate type arranged in a NOR array 12 as disclosed in U.S. Pat. No. 5,668,757, which disclosure is incorporated by reference. As disclosed in U.S. Pat. No. 5,668,757 programming of the memory cell occurs by hot channel electron tunneling. Further, in the preferred embodiment, although the device 10 has its non-volatile memory cells arranged in a NOR array 12, the device 10 emulates the operation of a NAND type page mode device. However, it should be noted that the present invention is not limited to this specific density or configuration or mode of operation.

The memory cell array 12 is located in the center of the device 10. On the left side of the array 12, a control gate decoder 14 is located. On the right side of the array 12, a word-line decoder 16 is located. A plurality of page buffers 18 are placed on the upper side of the array 12. In the preferred embodiment, there are 512×8 page buffers that correspond to a page of 1024×8 memory cells. Peripheral circuits 24 are located on the upper side of the device 10. On the left side of the device 10, charge pumps 22 are placed. On the right side of the device 10, the current pumps 20 are placed. In the vicinity of corners of the device 10, pads (such as I/O, power and control) are placed.

Since the memory cell array is configured as 8M×8-bit, the entire memory cell array 12 is divided into 8 identical sub-arrays (sub-array 12-0 sub-array 12-1, ... sub-array 12-7). Each sub-array has a corresponding I/O. Thus, sub-array 12-0 corresponds to I/O-0, ... sub-array 12-7 corresponds to I/O-7. Although the memory cell array 12 is divided into 8 identical sub-arrays 12-n, each word line from the word line decoder 16, and each control gate line from the control gate decoder 14 runs "horizontally" across all eight identical sub-arrays 12-n. In the preferred embodiment, a word line and a control line crosses 1024×8 cells, with each cell each having an associated bit line. Thus, there are 1024 cells in each sub-array 12-n. Within each sub-array 12-n, there are 512 page buffers 18. Thus, there are two memory cells associated with each page buffer 18. To simplify the illustration, only one of the 8 sub-arrays 12-n and its corresponding page buffers 18-n is described and shown in the following drawings.

Figures 1, 2A:
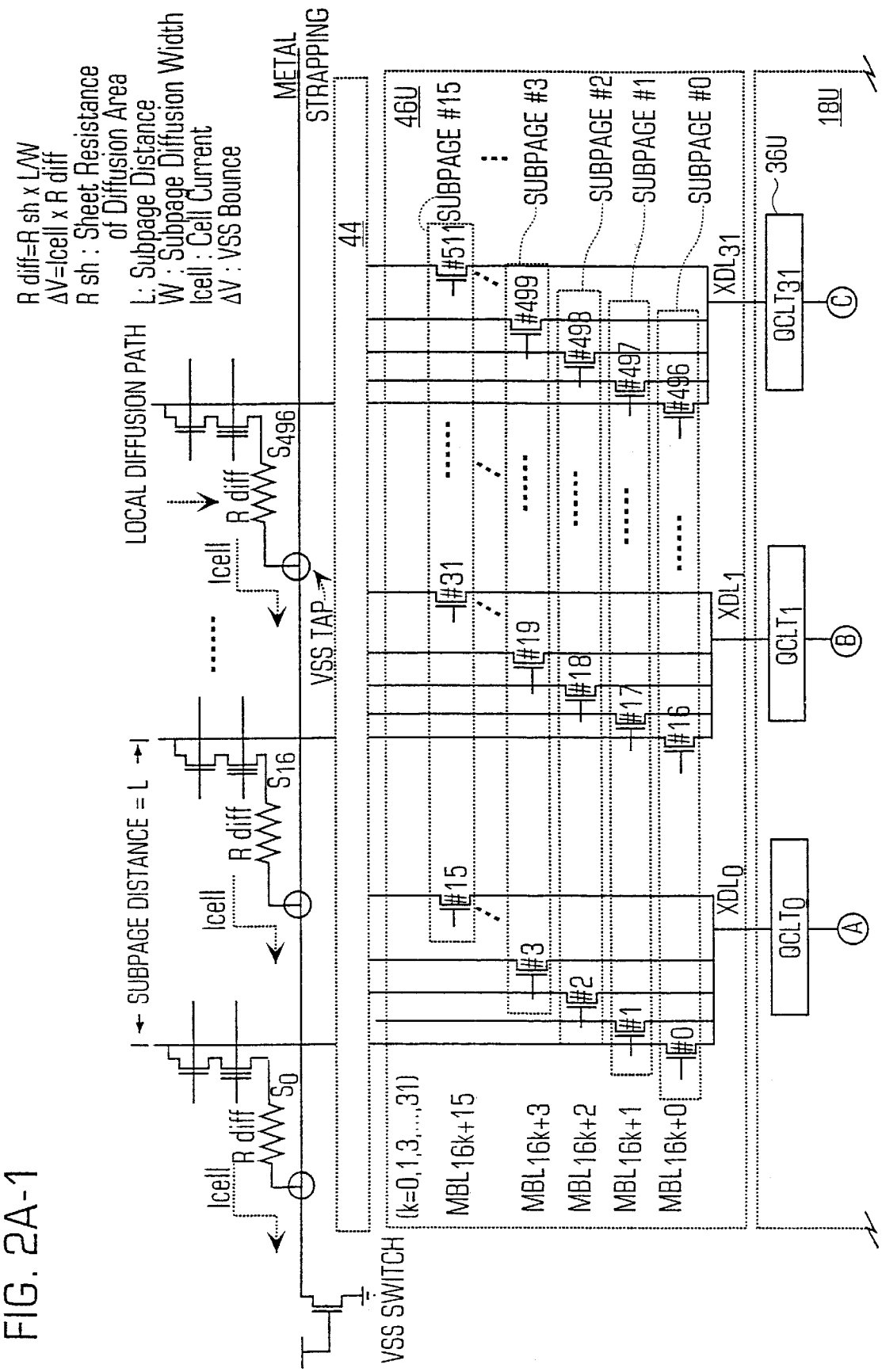
FIG. 2A is a schematic diagram showing the connection of the bit lines to page buffers and the grouping of page buffers into sub-pages in the device of the present invention.
Figures 2, 2A:
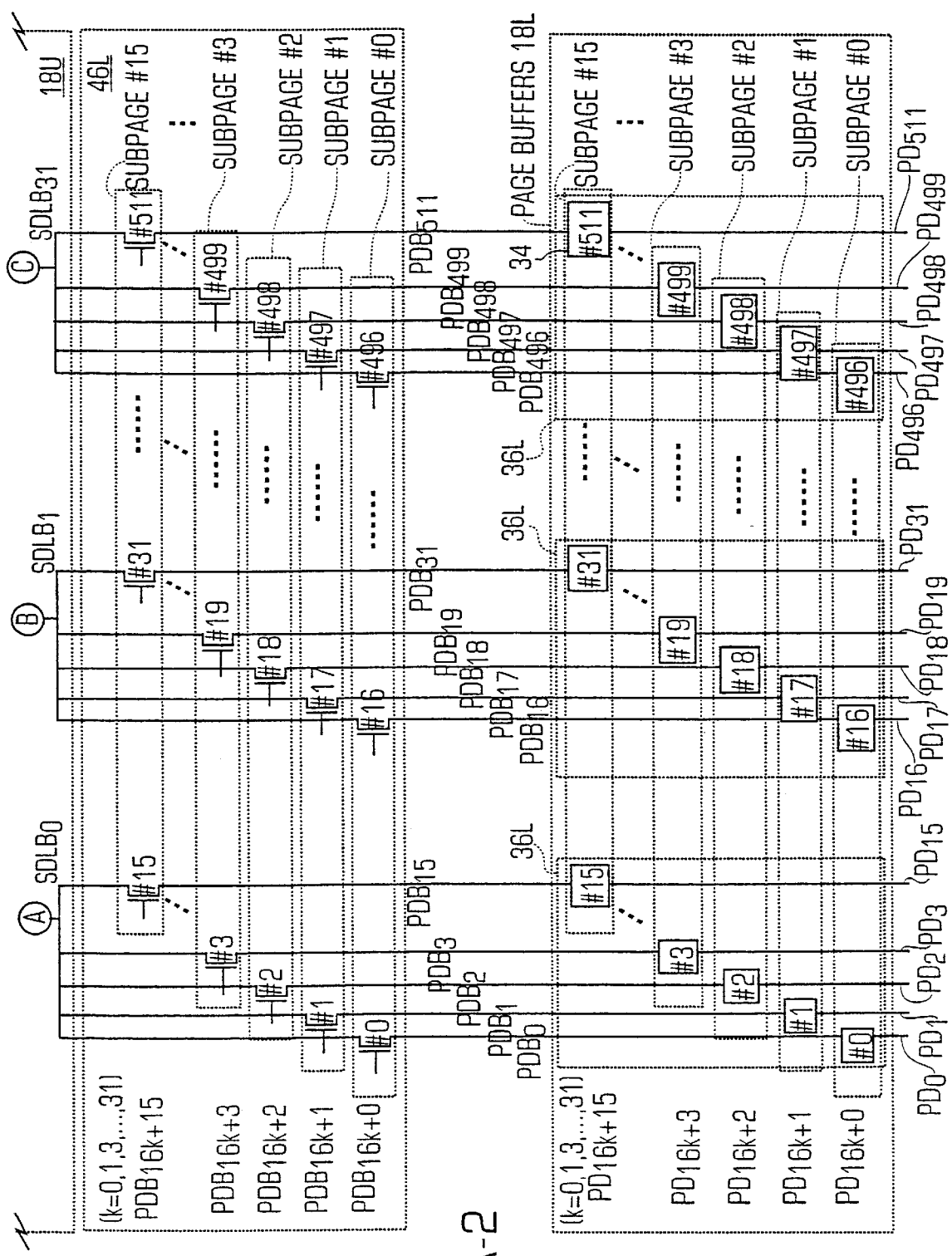

Referring to FIG. 2A, a plurality of adjacent signal lines PDB0 to PDB511 are connected to page buffers 18L. Each signal line PDB is connected to one page buffer 18L. Therefore, there are 512 page buffers 18L. Each signal line PDB is further eventually connected to a pair of immediately adjacent bit lines BLj and BL(j+1) through bit line switches 46L, sense amplifiers 36U, and bit line switches 46U and 44 to the memory array 12 (see FIG. 3). Thus, the 512 PDB lines connected the 512 page buffers to 1024 bit lines BL. Each bit line (BLx) is in turn connected to a column of non-volatile memory cells. When a particular row of memory cells is selected there are 1024 memory cells associated with the 512 PDB lines. All the 512 (from #0 to #511) page buffers 18L that are connected to the signal lines PDB0-PDB511 are further grouped into 16 interleaved sub-pages 18L-n. Thus, each sub-page 18L-n comprises 32 page buffers 18L. The grouping of each sub-page 18L-n and its members are as follows:

Sub-page n comprises PDB [16k+n] where
n=0,1, ... , 15; k=0,1, ... , 31;

Thus, Sub-page 18L-0 comprises page buffers 18L connected to PDB [0], [16], [32], [48], ... [496]

Sub-page 18L-1 comprises page buffers 18L connected to PDB [1], [17], [33], [49], ... ,[497]

Sub-page 18L-2 comprises page buffers 18L connected to PDB [2], [18], [34], [50], ... ,[498]

...

...

Finally, sub-page 18L-15 comprises page buffers 18L connected to PDB [15], [31], [47], [63], ... , [511]

As can be seen from the foregoing, each sub-page 18L-n comprises page buffers 18L that are not located immediately adjacent to one another. Instead, page buffers 18L of the same sub-page 18L-n are connected to signal lines PDB that are spaced equal distance apart (namely by the size of 15 page buffers 18L) from one another and are grouped together to form a sub-page. Thus, the 16 sub-pages 18L-0–18L-15 are interleaved with one another. With this arrangement, the current drawn by selected memory cells during a sub-page pre-fetch can be spread out evenly across the whole memory cell sub-array 12-n rather than being crowded over an area as narrow as the pitch of 32 adjacent PDB signal lines. The distance between two adjacent PDBs is carefully selected based on the sheet resistance of source diffusion area of memory cells.

Figure 2B:
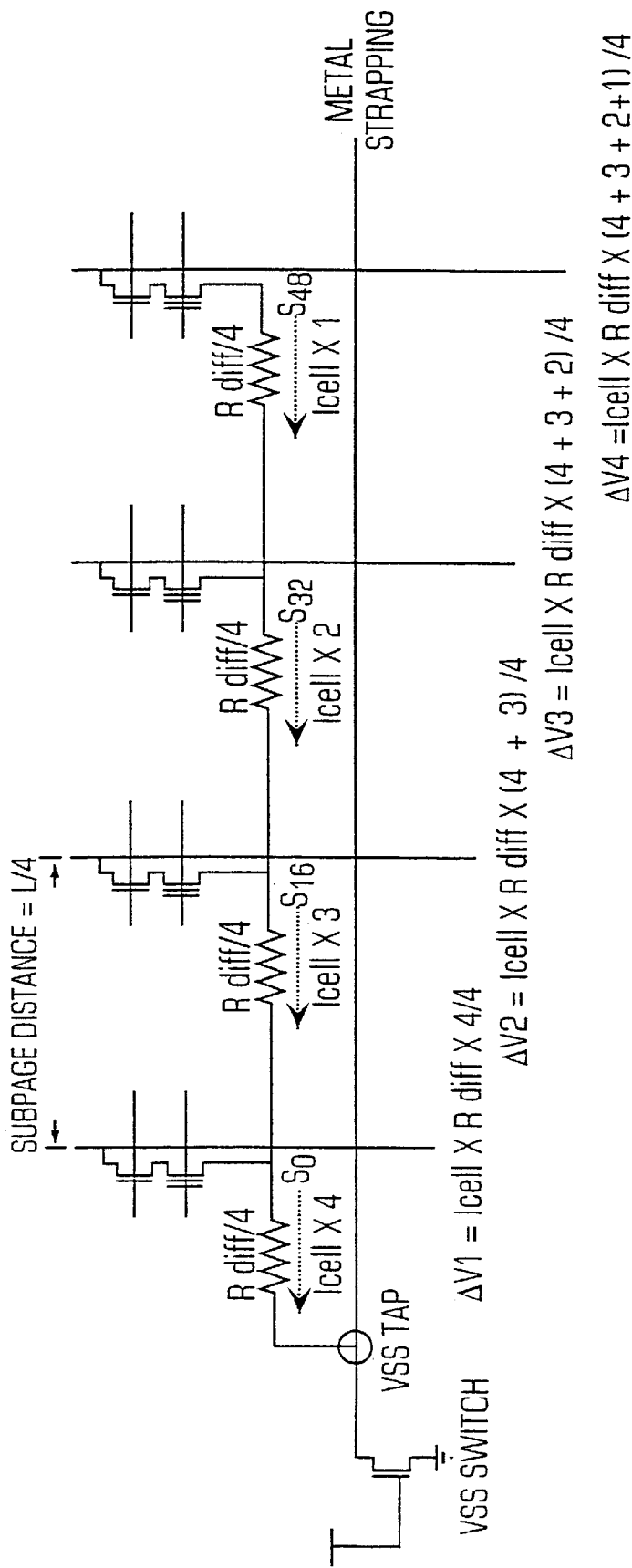
FIG. 2B is a schematic diagram showing the connection of the metal strapping to VSS.

Referring to FIG. 2A, the source line of each memory cell is connected together by a local diffusion path. A metal strapping runs through the cell array horizontally. Periodic VSS taps are made to connect the local diffusion path to VSS. If the sub-page distance L is long enough to accommodate 1 VSS tap for each selected bit line as depicted in the figure, the VSS bounce (or ground bounce) will be minimized down to Icell×Rdiff. Where Icell is the cell current and Rdiff is the diffusion resistance. If the sub-page distance is reduced to L/4, 1 VSS tap is shared among 4 selected bit lines, the VSS bounce increases differently for those 4 bit lines as depicted in FIG. 2B. Therefore, an optimal value of L could be resulted from the trade off between the layout area penalty of VSS taps and the VSS bounce.

Figure 3:
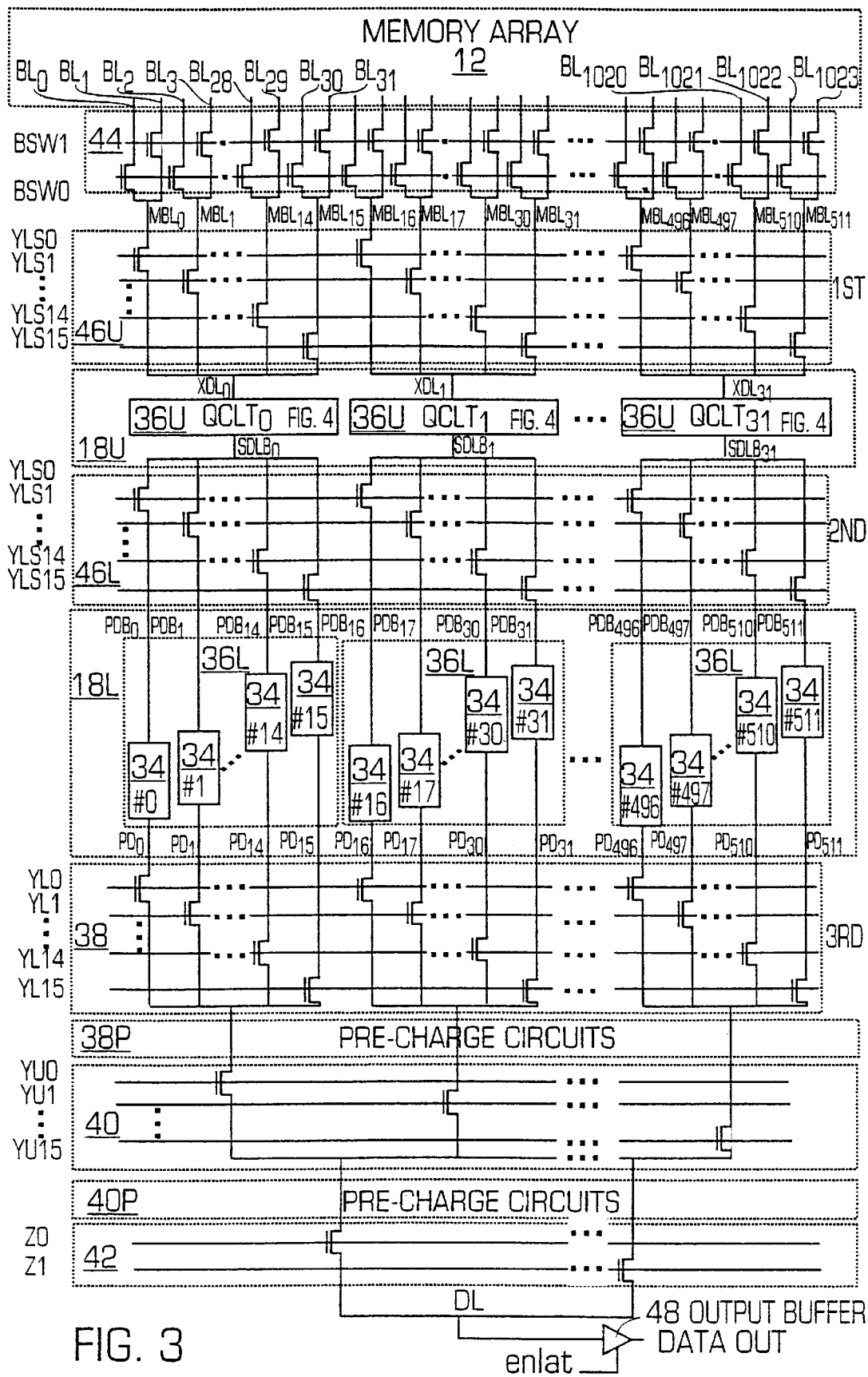
FIG. 3 is a detailed schematic circuit diagram showing the connections between the bit-lines from the memory array to the sensing circuits and from the sensing circuits to page buffers, and the connections from page buffers to output buffers of the device of the present invention.

Referring to FIG. 3 there is shown a schematic diagram of the interconnection of the bit lines BL0 ... BL1023 from the memory array 12 (shown in FIG. 1) to the output of the device 10. The 1024 bit lines from the memory array 12 are first supplied to bit line switches 44. The 1024 bit lines supplied to the bit line switches 44 are reduced to 512 signal lines MBLx (x=0, 511). Thus, each pair of adjacent bit lines BLj and BL(j+1) are connected to a signal line MBLx. The 512 signal lines MBLx are supplied to a first column decoder 46U. The first column decoder 46U also receives the column signals YLS(0 ... 15). Each 16 adjacent MBL signal lines is assigned to 1 XDL line. Thus, the 512 MBL signal lines are decoded to 32 XDL lines. The first column decoder 46U functions as a multiplexer/de-multiplexer in selecting one of 16 MBL lines to be connected to a single XDL line. Each of the 32 XDL lines is supplied to a respective sensing circuit 36U. Thus, there are 32 sensing circuits 36U in the first section 18U of the page buffer 18U/18L.

Since each sensing circuit 36U is associated with 32 bit lines BL, the size (width) of each sensing circuit 36U can be 32 times the pitch or size (width) of each memory cell. Therefore, the sensing circuit 36U can be very large compared to each memory cell.

Figure 3A:
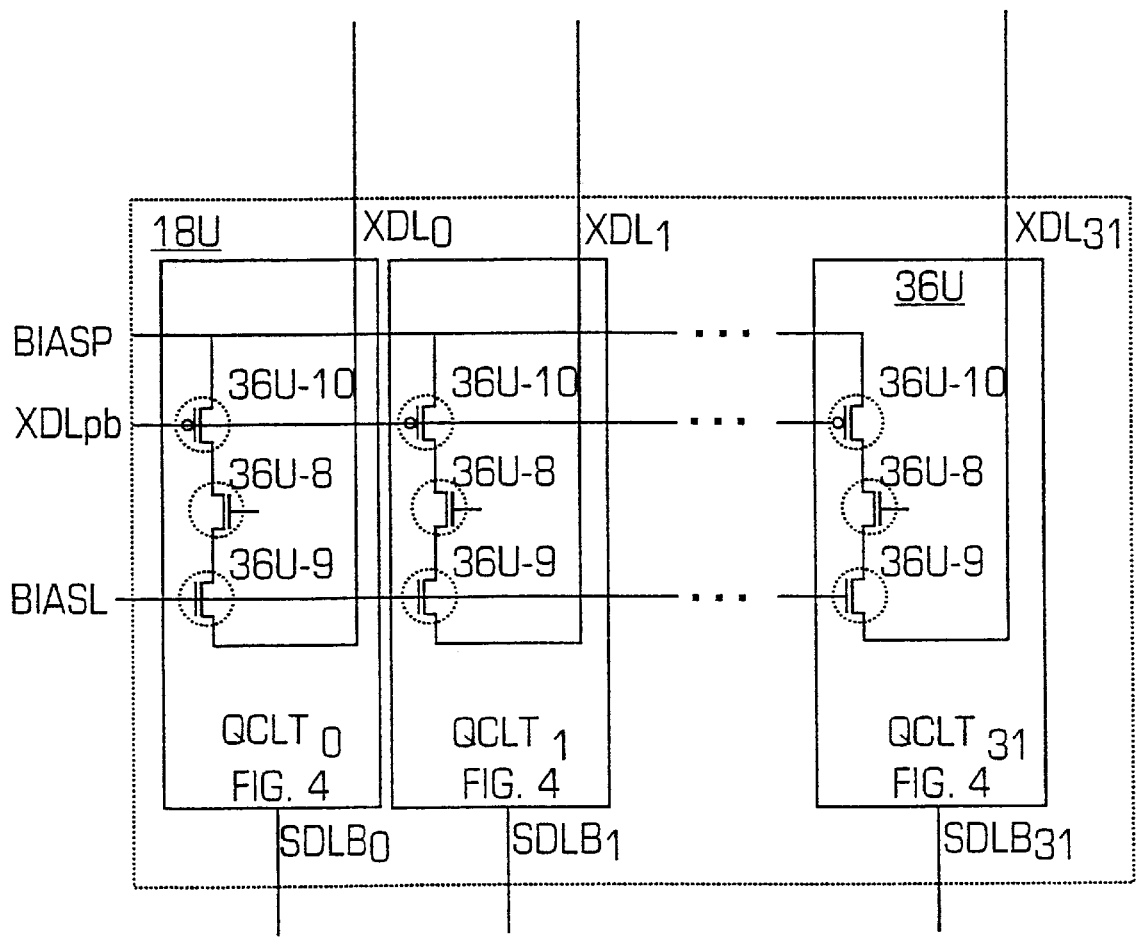
FIG. 3A is a detailed circuit diagram showing the bit-line pre-charge circuits of the device of the present invention.

FIG. 3A is a schematic circuit diagram showing the bit-line pre-charge circuits 36U-8/36U-9/36U-10. These pre-charge transistors are used to pre-charge the selected bit-lines to the predetermined voltage level BIASP before starting the page-mode read operation. The pre-charge transistor is activated by the signal XDLpb.

Each sensing circuit 36U has an output SDLBx (0 ... 31). The 32 SDLB lines are supplied to a second column decoder 46L which is also decoded by the column signals YLS(0 ... 15), and connect the 32 SDLB lines to 512 PDBX (0 ... 511) lines. The second column decoder also functions s a multiplexer/de-multiplexer in connecting a single output of a QCLT 36U to one of selected 16 PDB lines. The 512 PDB lines are supplied to a plurality of latches 34 in the second section 18L of the page buffer 18U/18L, with one latch 34 associated with each of the 512 PDB lines. The 512 latches 34 are grouped into 32 sub-pages 36L. Each sub-page 36L comprises 32 latches 34 with each latch 34 associated with a PDB line spaced apart from one another, all as discussed with reference to FIG. 2A.

The output of the each latch 34 is connected to an output line PDx (in reality the output line PDx is a pair of output lines, comprising PDx and PDx(bar)). Since there are 512 latches, there are 512 output lines PDx. 16 adjacent latches 34 and their associated output lines PD(x, x+15) are grouped together to form a group. In total there are 32 groups of output lines PDx. The 32 groups of output lines PDx are supplied to a third column decoder 38, which also functions as a multiplexer/de-multiplexer. The third column decoder 38 selects one of the output lines PDx from each group 36L, based upon the select signals YL0 ... YL15. Thus, the third column decoder 38 selects 32 outputs, one from each group 36Lx, representing all of the outputs of the latches 34 from the same selected sub-page 18-n.

The 32 outputs of the third column decoder 38 are supplied to a pre-charge circuit 38P, which outputs the 32 signals at nodes DLU0 . . . DLU15, DLU0 . . . DLU15. (shown in FIG. 3B) (Again, each line represents a pair of output lines.) The pre-charge transistors of the pre-charge circuit 38P are used to pre-charge the intermediate nodes DLUx before switching the third column decoders 38.

Figure 3B:
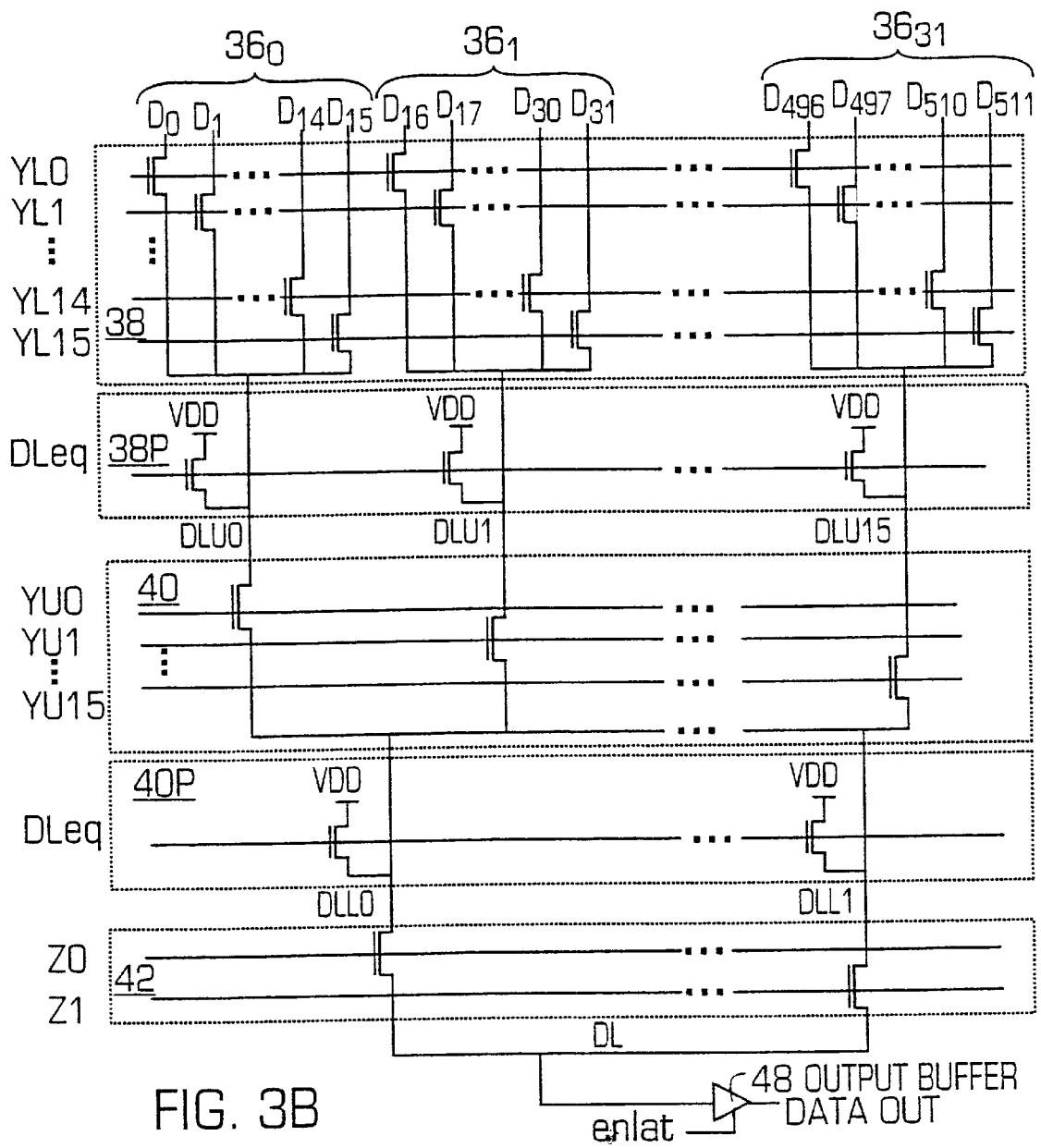
FIG. 3B is a detailed circuit diagram showing the data line pre-charge circuits of the device of the present invention.

FIG. 3B is a schematic circuit diagram showing the DLUx pre-charge circuits 38P/40P.

From the output of the pre-charge circuit 38P, the signals DLU0 . . . DLU15, DLU0 . . . DLU15 are supplied to the fourth column decoder 40. The fourth column decoder 40 selects one of the output lines from the first group of 16 DLU signals, and one of the output lines from the second group of 16 DLU signals, based upon the select signals YU0 . . . YU15. Thus, the fourth column decoder 40 selects 2 outputs, with each being a pair of lines.

The two outputs from the fourth column decoder 40 are supplied to a pre-charge circuit 40P, which outputs the 2 signals at nodes DLL0 and DLL1. The pre-charge transistors of the pre-charge circuit 40P are used to pre-charge the intermediate nodes DLLx before switching the fourth column decoders 40.

From the pre-charge circuit 40P, the signals DLL0 and DLL1 are supplied to the fifth column decoder 42, which selects one of the signals as the output DL (a pair output lines: DL and DLB), based upon the select signals Z0 and Z1. The selected signal DL (DL and DLB) from the fifth column decoder 42 is supplied to the output buffer 48.

Thus, through the action of the third, fourth and fifth column decoders 38/40/42 one signal (both the signal and its complement) stored in a latch 34 from a selected sub page 18L-n is outputted from the device 10. The pre-charge circuits 38P/40P serve only to pre-charge certain nodes before the column decoders 38/40/42 are activated. Since all these intermediate nodes DLUx/DLLx are loaded with large parasitic capacitance, any switching on the column decoders 38/40/42 will cause disturbance to the data latches 34. To prevent this disturbance, all DLUx/DLLx nodes must be pre-charged to VCC−VTN before switching.

Figure 3C:
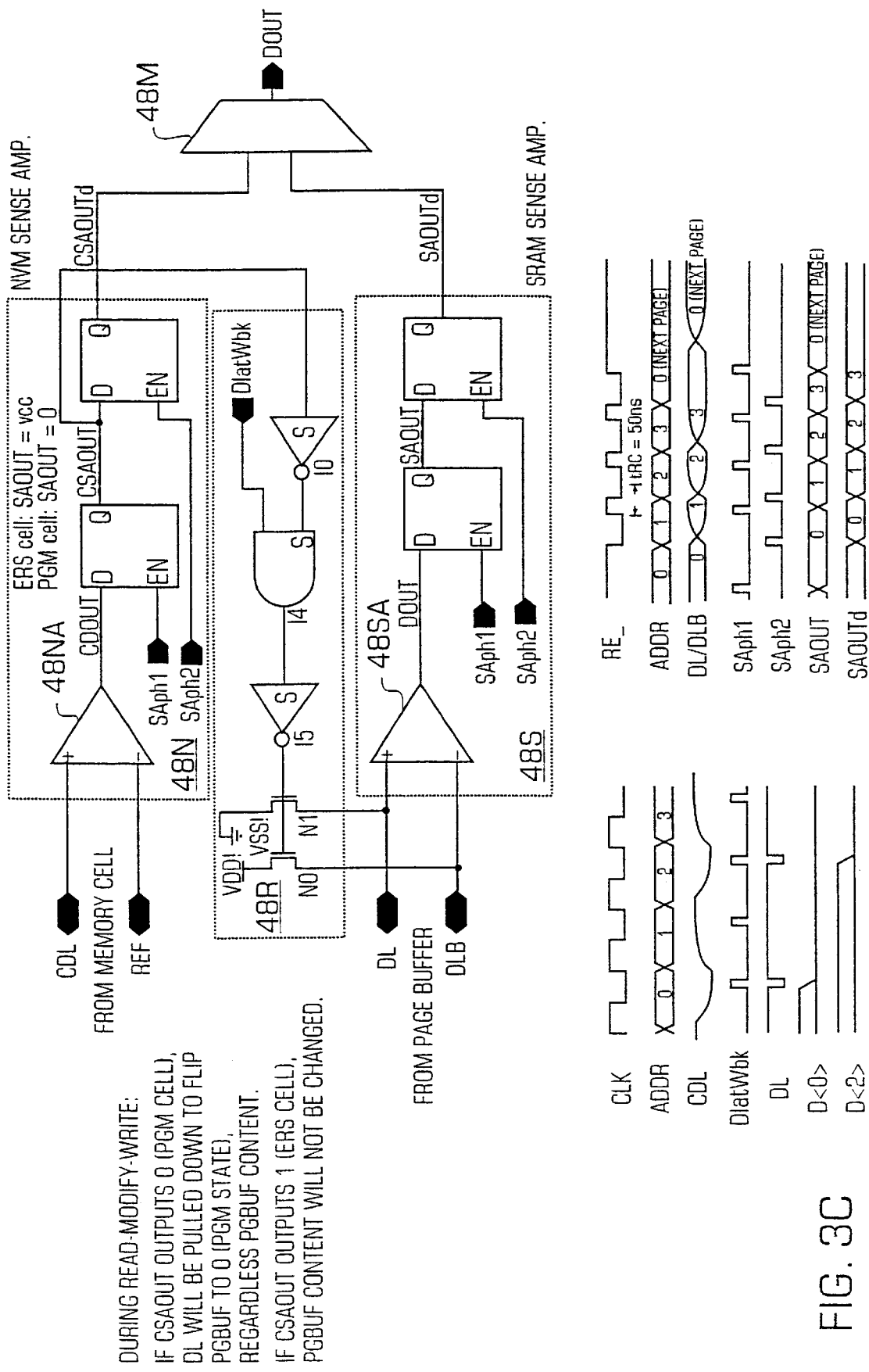
FIG. 3C is a circuit diagram showing a sense amplifier and the read-modify-write circuit associated with each page buffer of the device of the present invention.

FIG. 3C is a schematic circuit diagram showing in detail the output buffer 48. The pair of output signals DL and DLB, representing the data and data inverse signals from the output of a latch from the selected page buffer 18L, are supplied to a differential amplifier 48SA. The output, DOUT, of the differential amplifier 48SA, is supplied to a series of latches and is then supplied to a multiplexer/demultiplexer 48M. In the page mode of operation, this would be the path of the signal. However, the device 10 can also operate in a non-page mode, wherein the signal from a non-volatile memory cell is read out directly and not stored in the page buffer 18L. In that event, the signal from the non-volatile memory cell along with the signal from a reference cell are supplied to a sense amplifier 48NA. The output of the sense amplifier 48NA is supplied to a series of latches and to another input to the multiplexer/demultiplexer 48M. The output of the multiplexer/demultiplexer 48M is supplied as the output of the device 10.

The latched signal, CSAOUT, from the sense amplifier 48NA, is also supplied in a feedback manner to a feedback circuit 48R, which is connected to the output lines DL and DLB, and is used in a read-modify-write mode during programming operation, which will be discussed greater detail hereinafter.

Figure 4:
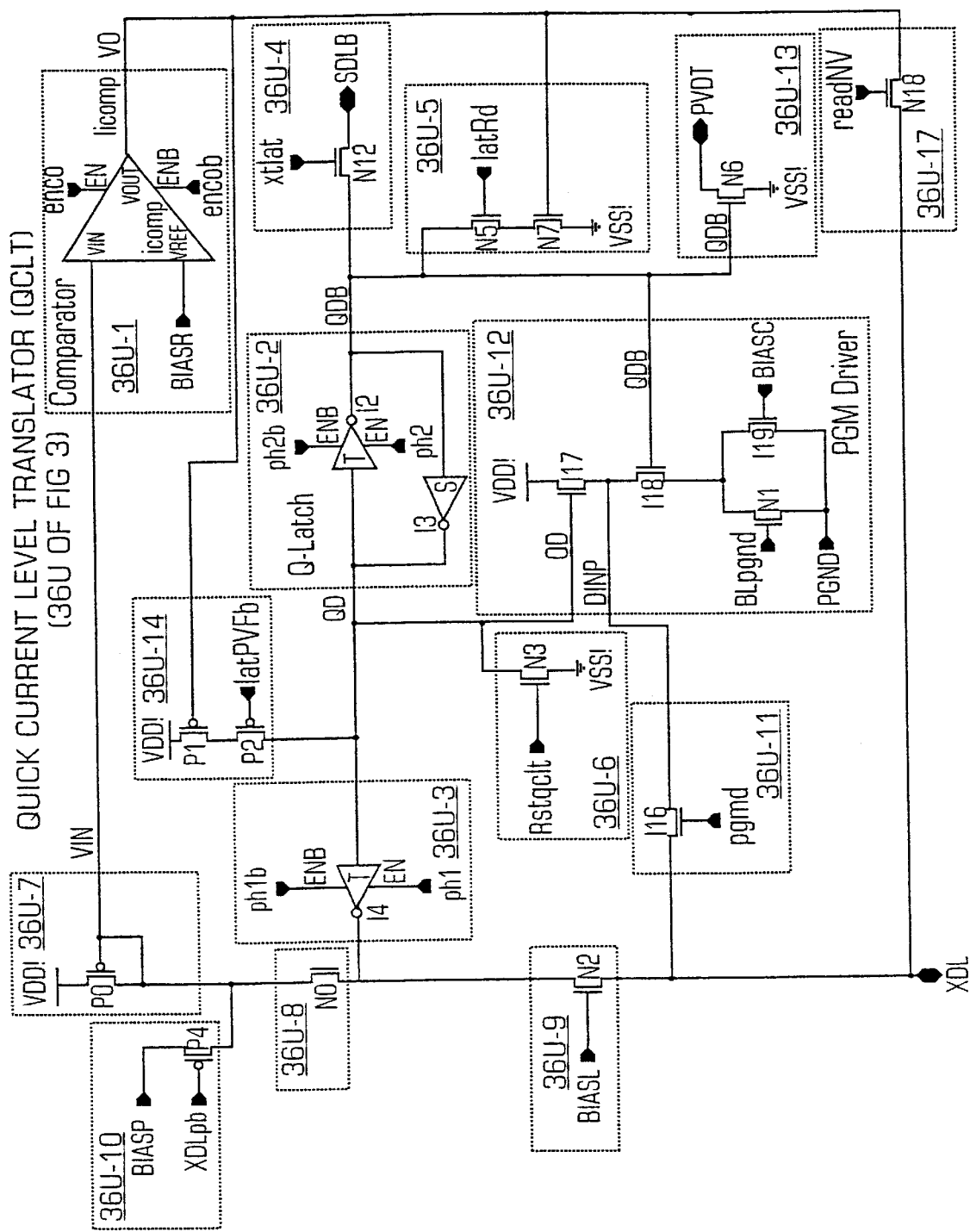
FIG. 4 is a detailed circuit diagram of one of the sensing circuits shown in FIG. 3.

Referring to FIG. 4 there is shown a detailed circuit diagram of the sensing circuit 36U shown in FIG. 3. The sensing circuit or quick current level translators (QCLT) 36U receives data on the input line XDL and supplies its output to SDLB. Each XDL is connected to a plurality of bit lines through the first column decoder 46U. Each SDLB is connected to a plurality of page latches 36L through the second column decoder 46L. Page latches are connected to corresponding output buffers through the column decoders 38/40/42.

The QCLT 36U is a current-mode analog-to-digital converter that converts the input current signal at local data line XDL to binary codes and stores the codes in the Q-latches 36U-2 shown in FIG. 4. The data stored in Q-latches 36U-2 will be transferred to page latches 34 for clocking out. In the prior arts of page-mode non-volatile memory, current sensing devices are usually combined with data storage devices to form a complicated page buffer. This complicated page buffer is often found difficult to layout within the tight bit line pitch. At the same time, the tight pitch also limits the delicacy of the page buffer design. Furthermore, in order to fit in the pitch, the current sensing devices are often made primitive. Unlike the prior arts, in the present invention, the sensing devices (QCLT) 36U are completely separated from the data storage devices (page latches 34). Every 32 bit-lines share 1 QCLT. The pitch for QCLT is greater. With this design, the sensing device QCLT can perform high precision current sensing while the page latch design can be made as simple as possible to fit in the tight pitch.

FIG. 4 is a schematic circuit diagram of the QCLT 36U. Each QCLT comprises a Q latch 36U-2, a current-mode comparator 36U-1, a program driving circuit 36U-12, a program verifying circuit 36U-13, a pre-charging transistor 36U-10, a PMOS transistor in diode connection 36U-7, a tri-state inverter 36U-3, pass-gate transistors 36U-8/36U-9/36U-11/36U-4/36U-17, a latch reset circuit 36U-6, two latch preset circuits 36U-5/36U-14, all as connected and as shown in FIG. 4. The operation of the QCLT 36U will be discussed hereinafter.

FIG. 4A is a schematic circuit diagram of a page latch 34. This page latch 34 is simply an SRAM cell.

Figure 4B:
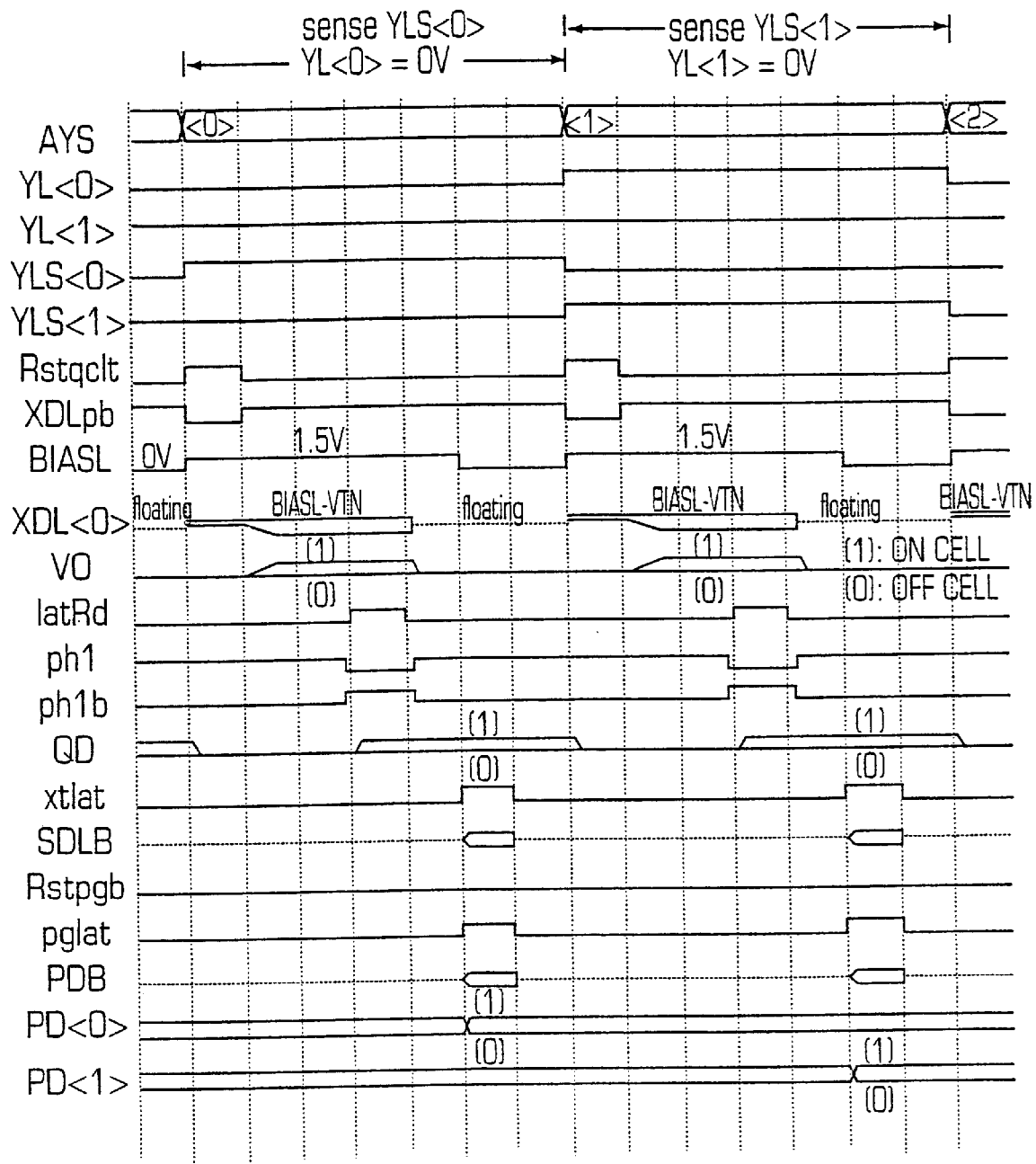
FIG. 4B is a timing diagram showing page-mode read operation for the device of the present invention.

The program/read operation of the QCLT 36U is as follows:

Referring to FIG. 4B there is shown a detailed timing diagram of the read operation for the present invention.

To perform the read operation, data node QD of the Q latch 36U-2 is first reset to 0V by reset circuit 36U-6. The selected bit line BLx (connected by XDL) is pre-charged to BIASL−VTN by pre-charge circuit 36U-10. PMOS transistor 36U-7 mirrors the cell current into the comparator 36U-1. If the selected cell conducts no current, output VO of the comparator 36U-1 stays at 0V. If the selected cell conducts current higher than a pre-determined value, VO becomes VCC. The data at node VO is supplied to the preset circuit 36U-5 and when signal latRd is high, the data at node QD will be supplied to VCC. While latRd is high, inverter 36U-3 is tri-stated to avoid noise feeding back to the comparator 36U-1. Data node QD will be transferred to node PD of page latch 34 (shown in FIG. 4A) through data line SDLB by switching signal xtlat and pglat both to high. Once data node QD becomes high after sensing, the pass gate transistor 36U-8 will be cut off and the comparator 36U-1 will be disconnected from the selected bit line XDL, and from the selected memory cell. By doing this, the selected memory cell will conduct no more current after sensing and the power consumption is greatly reduced.

Figure 4C:
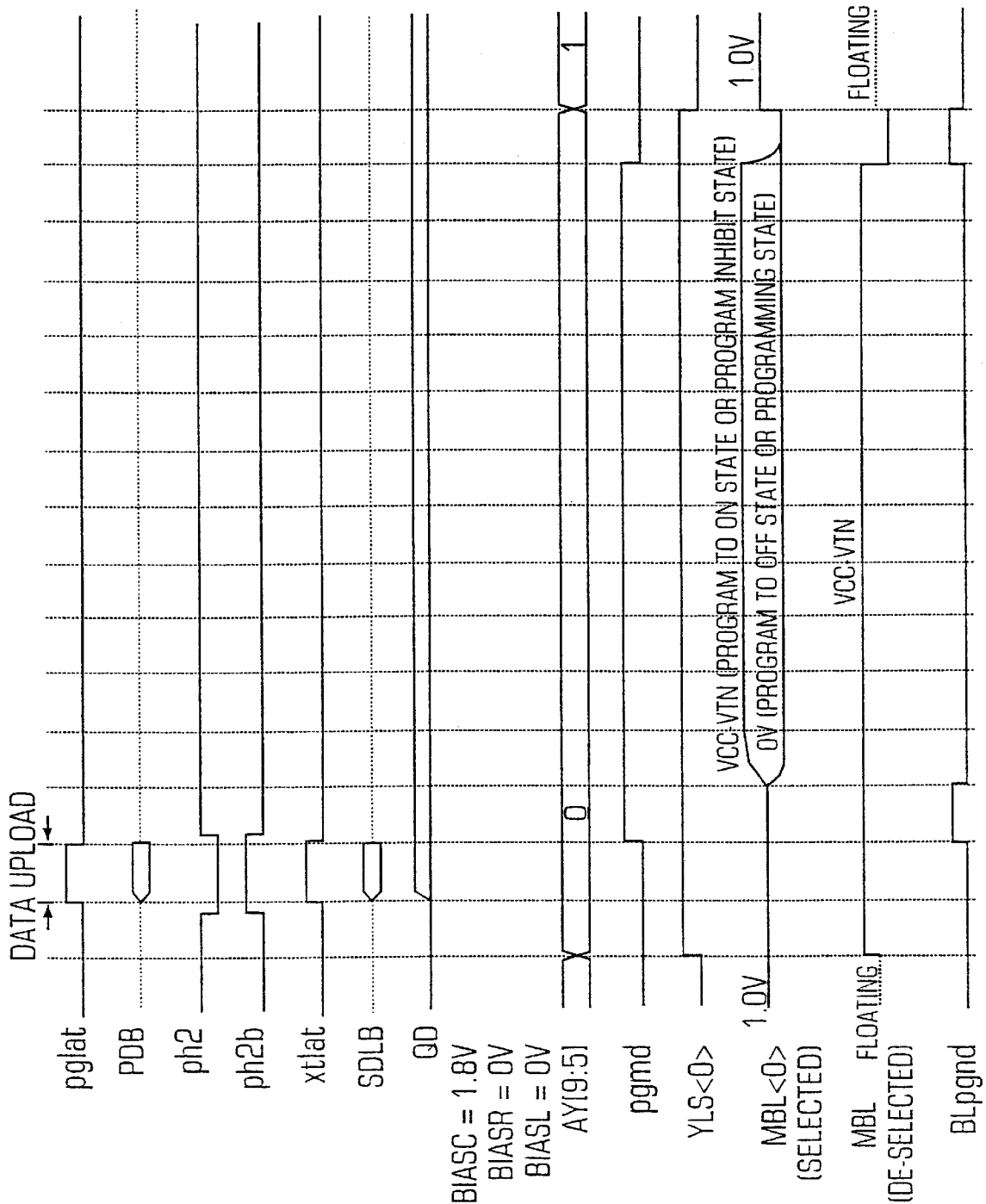
FIG. 4C is a timing diagram showing page-mode program operation for the device of the present invention.

Referring to FIG. 4C there is shown a detailed timing diagram for the programming operation for the present invention.

Before starting the program operation, all the page latches 34 are reset by signal Rstpgb. Then data to be programmed are loaded from IO pads to the selected page latches 34 through the third column decoder 38/40/42. Since node SDLB of each QCLT 36U is connected to a plurality of page latches 34, only one data from a page latch 34 can be uploaded to Q latch 36U-2 for programming during one program iteration. To upload the selected page latch data, pglat and xtlat are switched to high and Q latch 36U-2 is tri-stated by switching ph2 to low (ph2b to high). Next, signal pgmd turns on the pass gate transistor 36U-11 that connects the program driver circuit 36U-12 to local data line XDL. XDL is connected to the selected bit line through the first column decoder 46U.

Depending the data stored in Q latch 36U-2, the selected bit line will be driven to either VCC–VTN or 0V. If the selected cell is to be programmed to higher threshold voltage than its original value, its bit line will be pulled down to 0V (this is the program state). If the threshold voltage of the selected cell is not to be modified, its bit line will be pulled up to VCC–VTN (this is the program inhibit state).

Referring to FIG. 4D there is shown a detailed timing diagram for the program verification operation for the present invention.

Figure 4E:
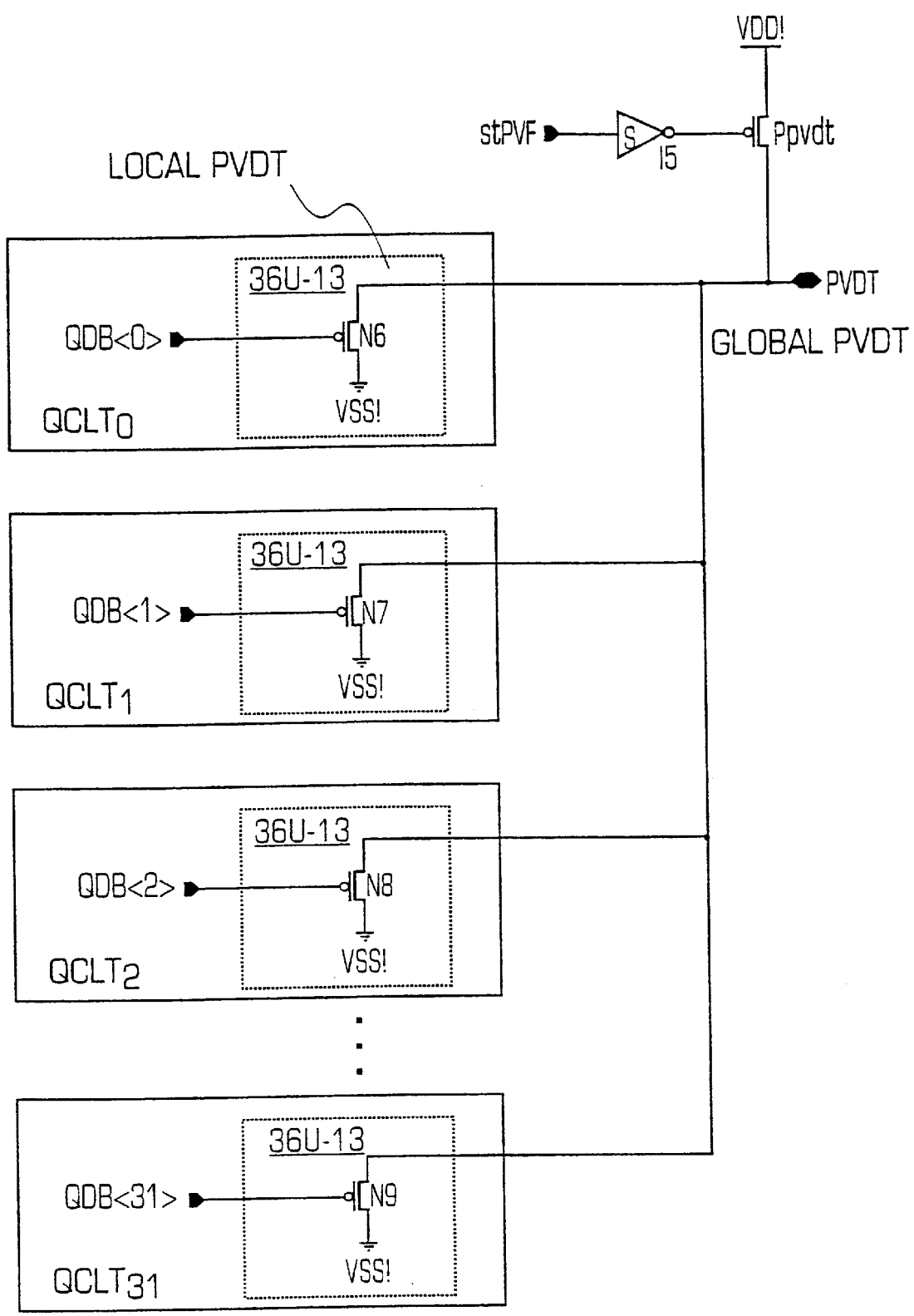
FIG. 4E is a schematic circuit diagram of a portion of the sensing circuit shown in FIG. 4, for program verification.

The program verification operation is similar to the current sensing operation depicted in FIG. 4B except that data node QD of Q latch 36U-2 is modified in a different way. In FIG. 4B, node QD will be flipped to 0V if the selected cell conducts current higher than a pre-determined value. In FIG. 4D, node QD will be flipped to VCC if the selected cell conducts no current. If the selected cell is successfully programmed, its threshold voltage will be higher than a pre-determined value and will conduct no more current under verification condition. Once this no-current state is reached, node QD will be flipped to VCC and its corresponding bit line will be pulled up to VCC–VTN ("program inhibit" state). Each QDB is wired-NOR to PVDT, as shown in FIG. 4E. If all QDB are high, PVDT will also become high. By checking PVDT, program iterations can be determined to be "PASS" or "FAIL".

Figure 4F:
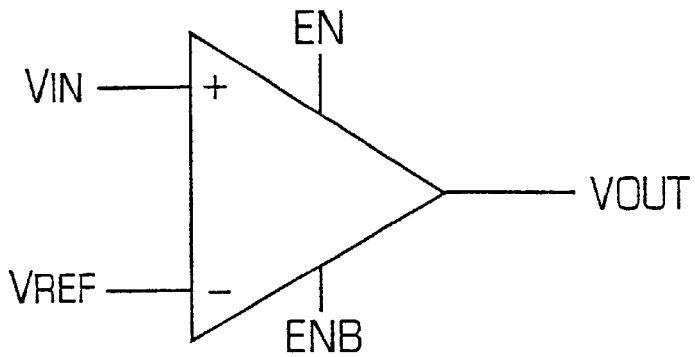
FIG. 4F is a detailed schematic circuit diagram of a portion of the sensing circuit shown in FIG. 4 for current comparison.
Figure 4F:
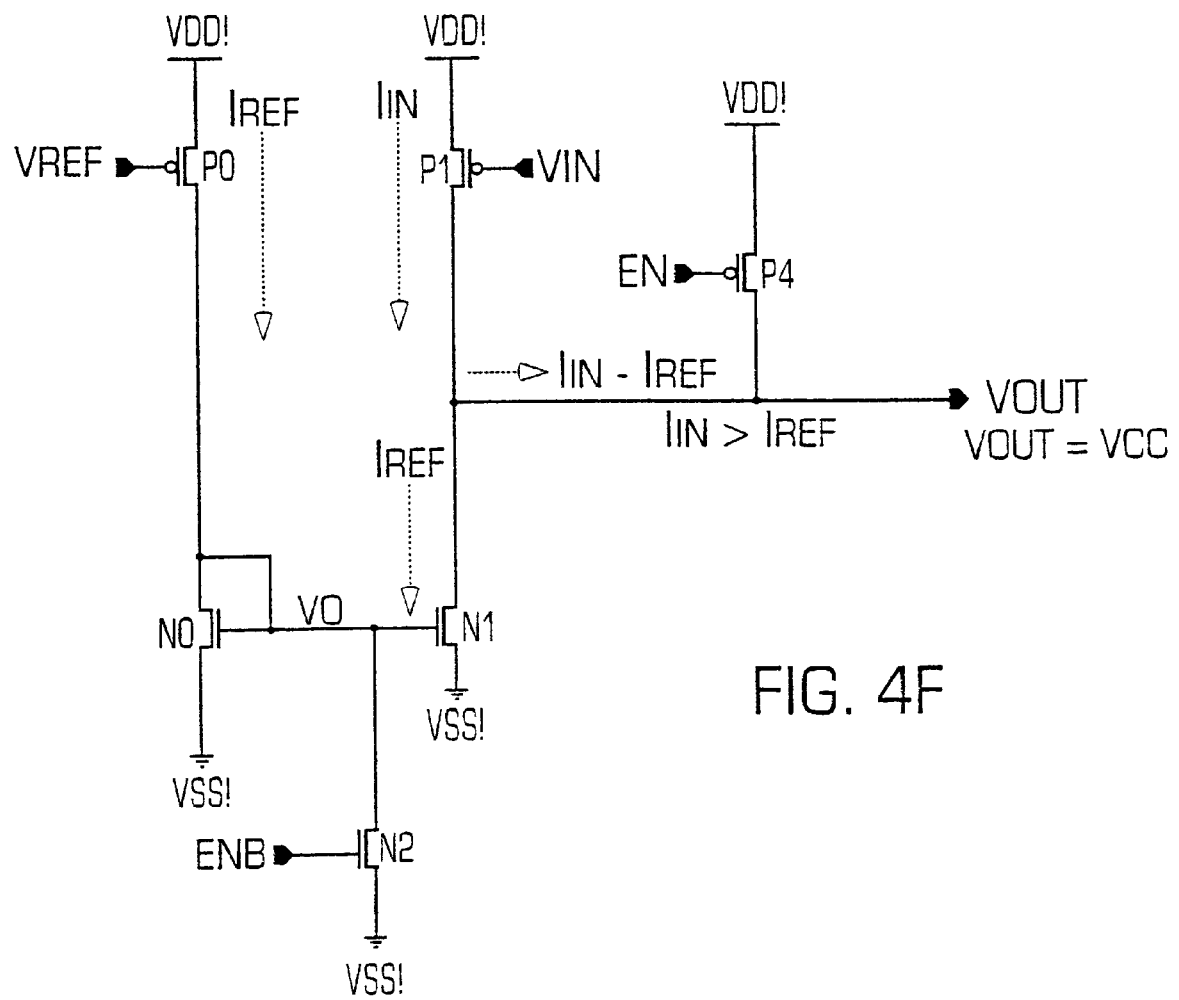

Referring to FIG. 4F there is shown a detailed circuit diagram of the current-mode comparator 36U-1. The comparator 36U-1 receives the input voltage line (shown as Vin in FIG. 4) and the reference voltage Vref (shown as BIASR in FIG. 4), converting to current signals Iin and Iref respectively, and based upon the comparison generates an output voltage Vout (shown as Vo in FIG. 4).

Figure 5:
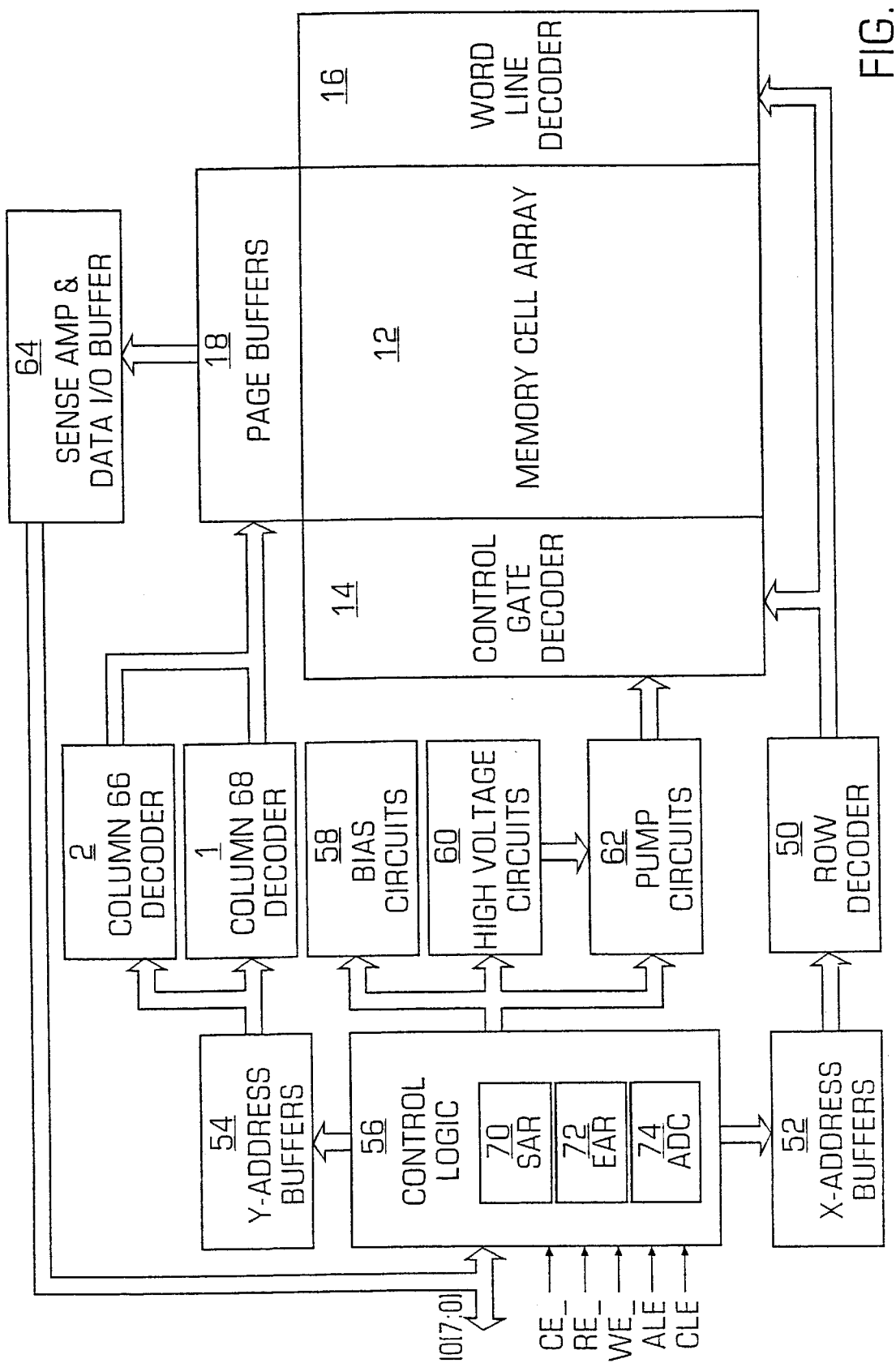
FIG. 5 is a schematic block diagram of the device of the present invention.

FIG. 5 is a circuit block diagram showing various circuits for performing program and read operations according a preferred embodiment of the present invention.

Figure 6:
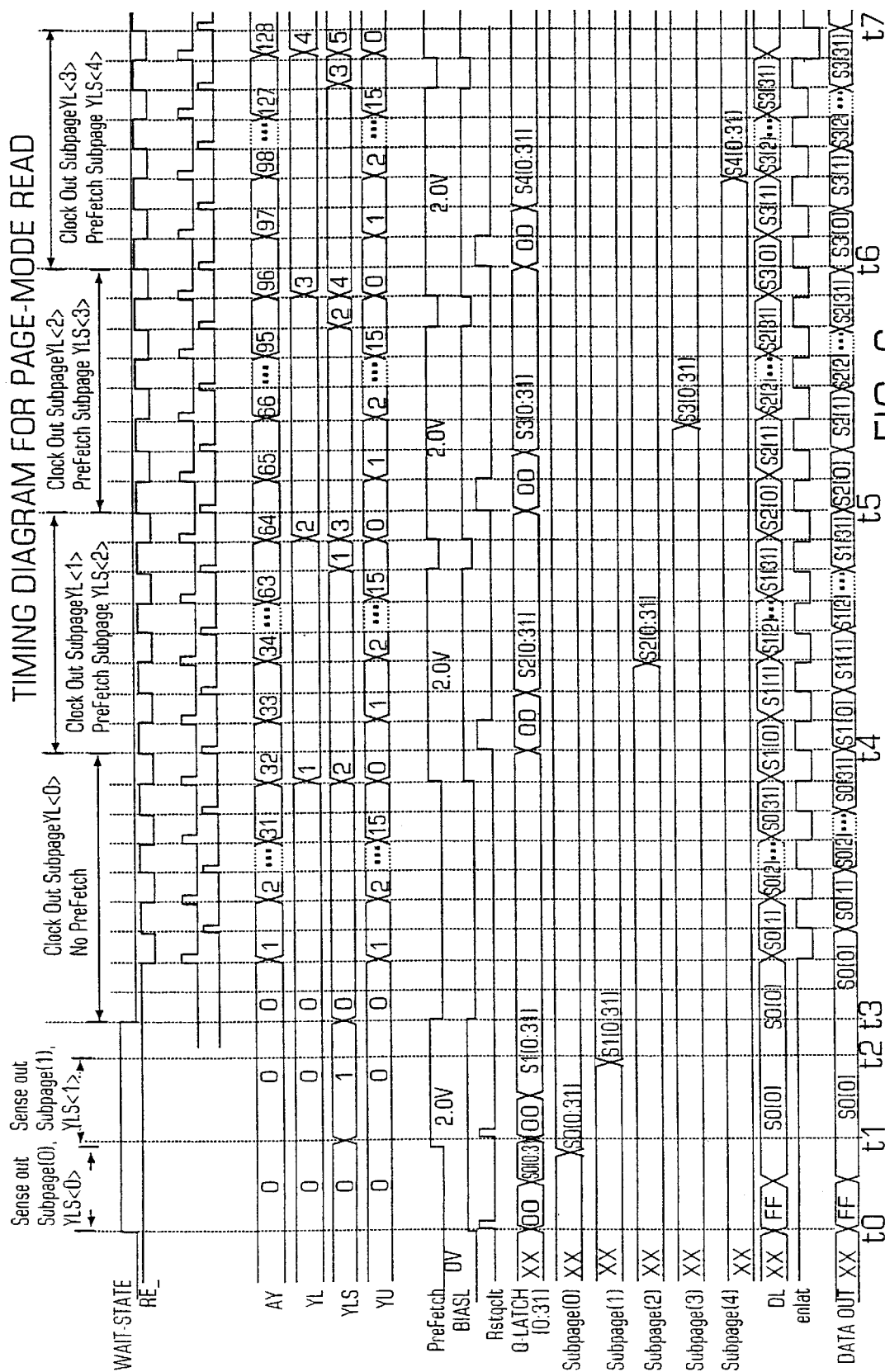
FIG. 6 is a timing chart showing the page-mode read operation for the device of the present invention.
Figures 1, 7:
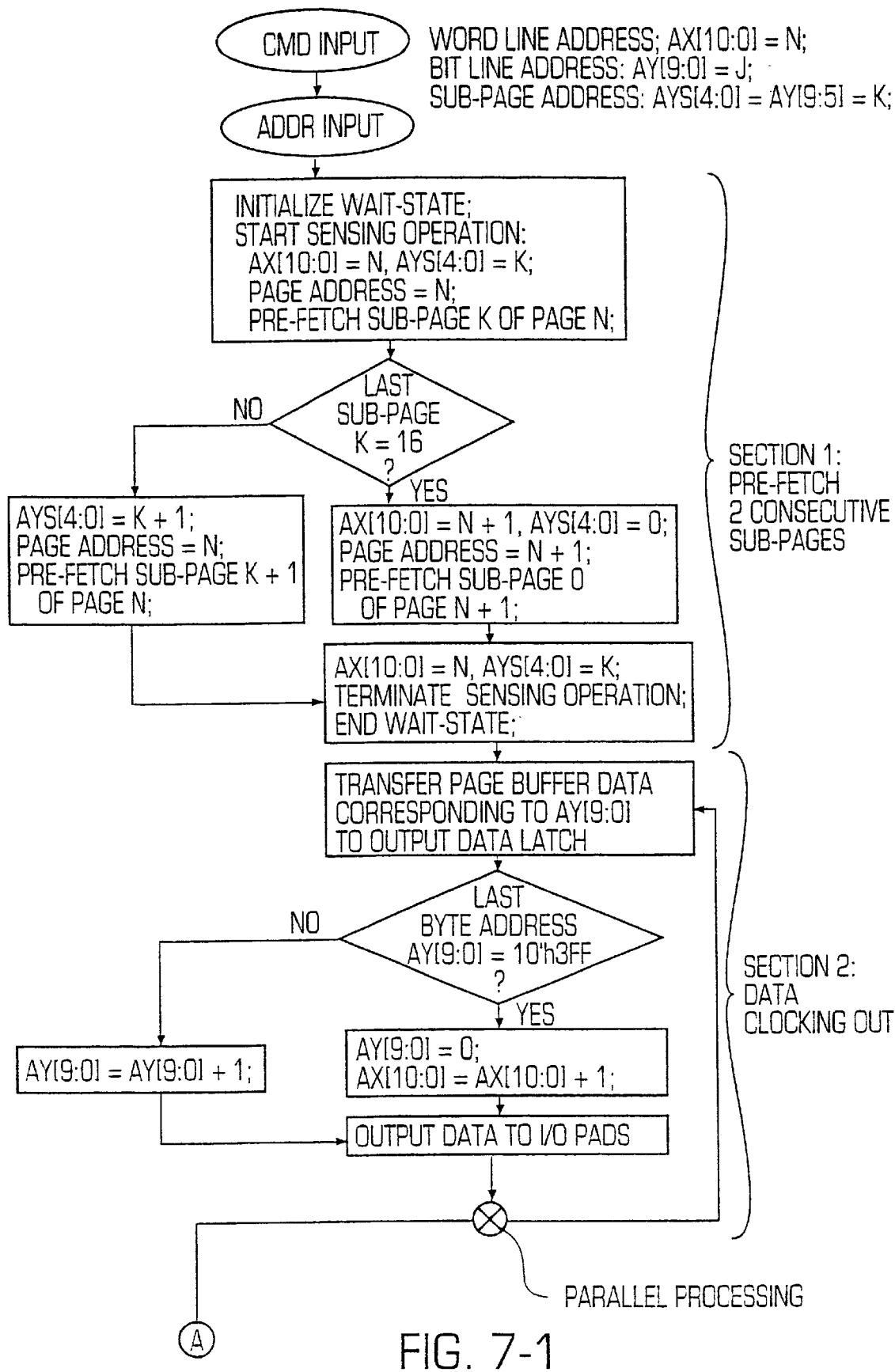
FIG. 7 is a flow chart showing the sub-page pre-fetch operation in the page mode read method of the present invention.
Figures 2, 7:
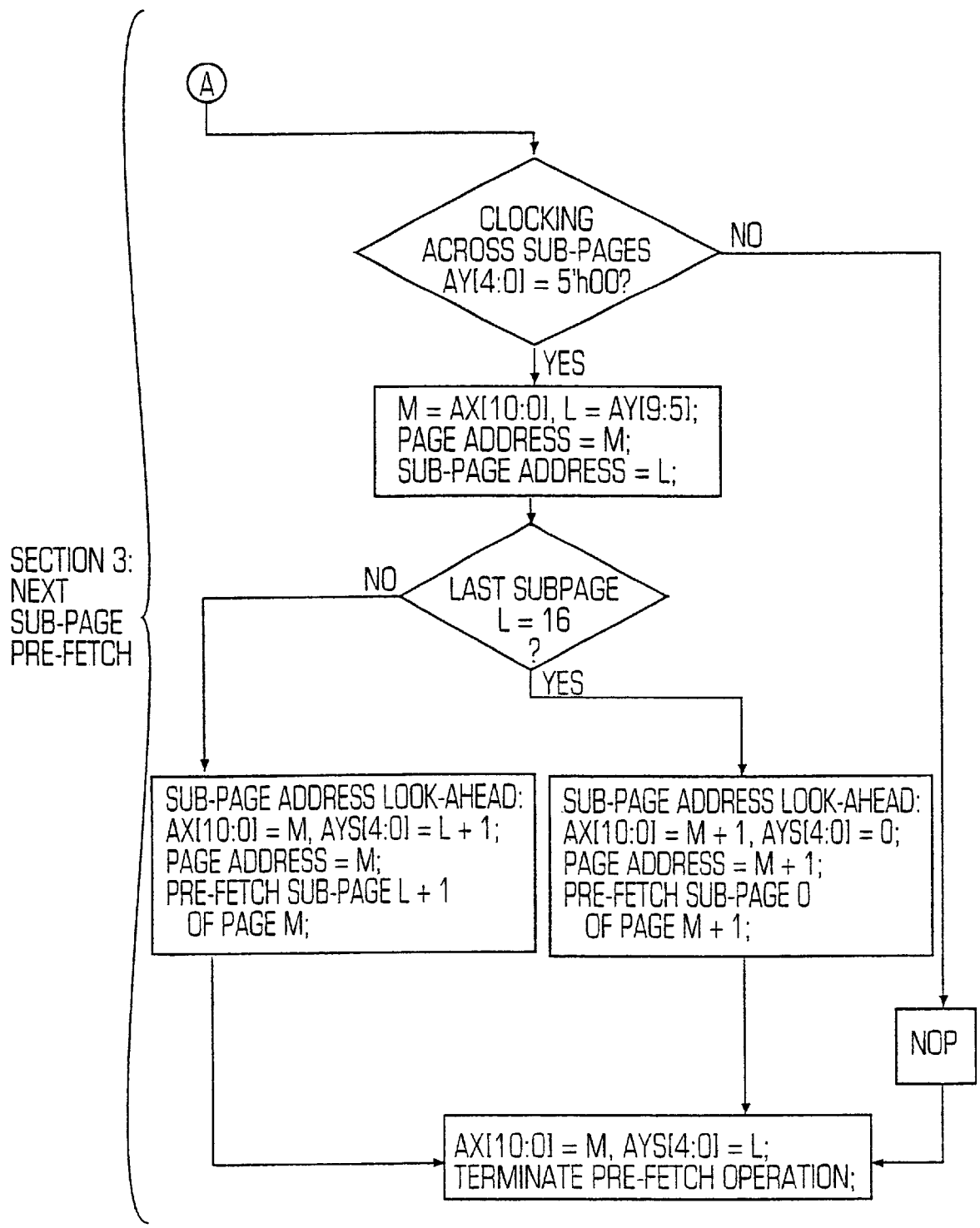

The device of the present invention is also capable of performing what is termed "gapless read" FIG. 6 is a timing chart for performing a page-mode gapless read operation. FIG. 7 is a flow chart for performing the page-mode read operation shown in FIG. 6.

In a "gapless read" operation, the pre-charge transistors of 36U-10 (shown in FIG. 3A) are used to pre-charge the selected bit-lines to the pre-determined voltage level BIASL–VTN before starting the page-mode read operation. The pre-charge transistor is activated by the signal XDLpb. The signal YLSx is a decoded signal which represents the selection of the particular sub-page 18L-x. When the particular YLSx is activated, it pre-charges those 32 bit lines associated with sub-page 18L-x. For example, if YLS0 is activated, then bit lines BL0, BL16, BL32, BL48, . . . , BL496 are all pre-charged to BIASL–VTN.

To perform the page-mode read operation, the Q latch 36U-2 is first reset by the latch reset circuit 36U-6 and the selected bit-line is pre-charged to the voltage level of BIASL–VTN by bit-line pre-charge circuits 36U-10. Depending on the data stored in the selected memory cell, MBL (or the bit line or column line) will be driven to either one of the two binary voltage levels: high or low after bit-line pre-charging. The data stored in memory cells can be in one of two states: ON or OFF. Each state represents one of the binary data: 1 or 0. If the selected memory cell is in an ON condition, this cell will draw current to discharge MBL from pre-charged level of BIASL–VTN down to 0V (low level). If the selected memory is in an OFF condition, this cell draws no current and MBL stays at the pre-charged level of BIASL–VTN (high level). After the pre-charged bit-line reach electrical steady state, the data stored in the selected memory cell is translated into the corresponding voltage level on XDL.

In the period shown as "sense out sub-page(0) YLS<0>" a particular sub-page x is selected. When the signal XDLpb goes low, the selected bit line is pre-charged. When YLS<0> first goes high, reset of latch 36U-2 occurs by Rstqclt being high, and the transistors in the first column decoder 46U are turned on. The memory cells from the selected sub-page x are then read and stored in the associated latches 34. In the next period shown as "sense out sub-page(1) YLS<1>" a second particular sub-page x+1 is selected. The memory cells from the selected sub-page x+1 are then read and stored in the associated latches 34. In the next time period shown as "clock out sub-page YL<0>" the data stored in the latches 34 associated with sub-page x is clocked out. In the next time period shown as "clock out sub-page YL<1>" the data stored in the latches 34 associated with sub-page x+1 is clocked out. At the same time, however, the data in the memory cells from a third particular sub-page x+2 is selected. The memory cells from the selected sub-page x+2 are then read and stored in the associated latches 34. Thereafter, in each time period, a read of the data from the latches 34 occurs while at the same time data from memory cells associated with another sub-page group is read and is stored in their associated latches.

Figure 8:
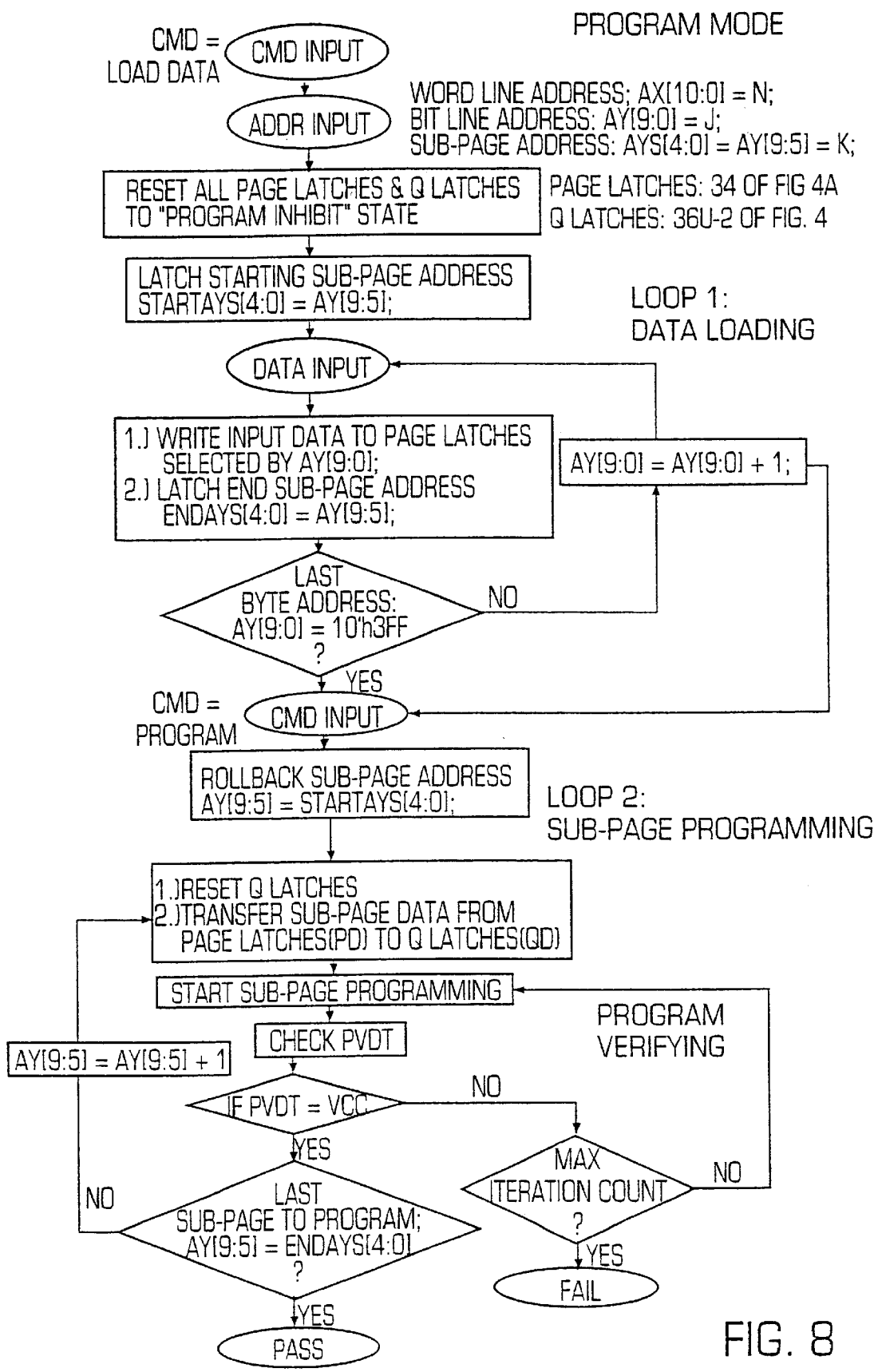
FIG. 8 is a flow chart showing the sub-page programming operation in the page mode program method of the present invention.

FIG. 8 is a flow chart for performing the page-mode program operation related to FIG. 4C–4D. This flow chart comprises 2 main loops. Before starting the program operation, all the page latches must be reset to "program inhibit" state and a starting address must be input to the on-chip address counter. The starting address for programming will be latched by a first set of on-chip address registers. In loop 1, bytes of data will be loaded into page latches sequentially. As the address counter increments, a second set of address registers store the latest address as the end address for programming. In loop 2, consecutive sub-pages will be programmed successively. As stated above, 2 sets of address registers are used to store both the starting and end address for programming. Therefore, in this loop, only those sub-pages that are previously loaded with data in loop 1 will be programmed. Program verification is also embedded for each sub-page program in loop 2.

The circuits described heretofore can also be used to store multi-levels in a memory cell. In the following description, embodiments capable of performing multi-level page-mode read and program operation will be detailed.

Figure 9:
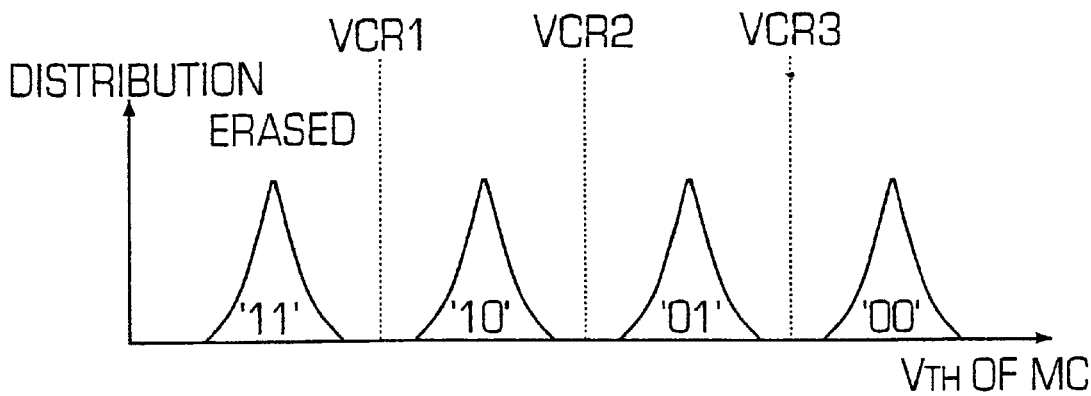
FIG. 9 is a diagram showing the threshold voltage distribution of multi-level cells and the detection of the cell current by switching the control gate voltage.
Figure 9:
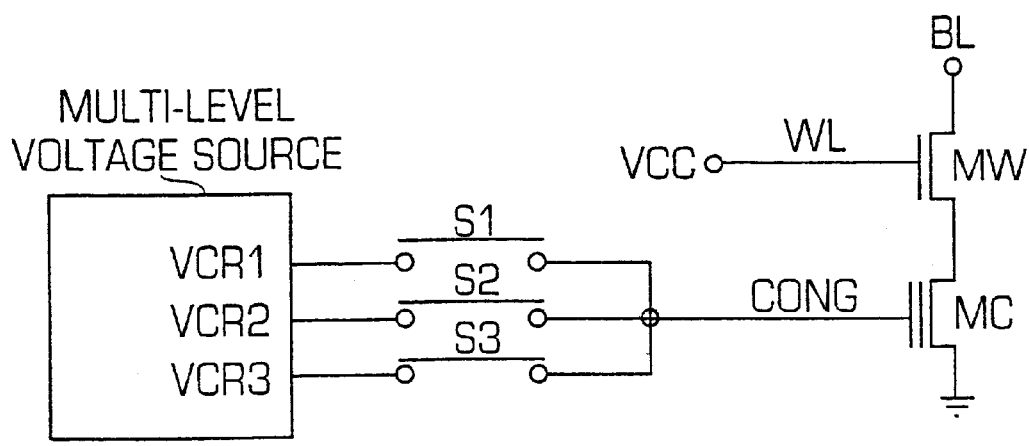

FIG. 9 shows typical threshold voltage distribution of a multi-level cells in a flash memory array. The cell threshold voltage falls into one of 4 groups. Two bits of binary codes are assigned to each group. In this figure, the group of lowest threshold voltage value is assigned state '11' while the group of highest threshold voltage value is assigned state '00'. With this state assignment, two bits of binary data are mapped to 4 threshold voltage levels. Hence, 2-bit binary data could be stored in the form of four different threshold voltage levels. To manipulate the threshold voltage level, cells are first erased to their lowest threshold level '11'. Then multi-step program iterations are used to boost up the threshold voltage incrementally until it reaches the desired level.

Figures 1, 10:
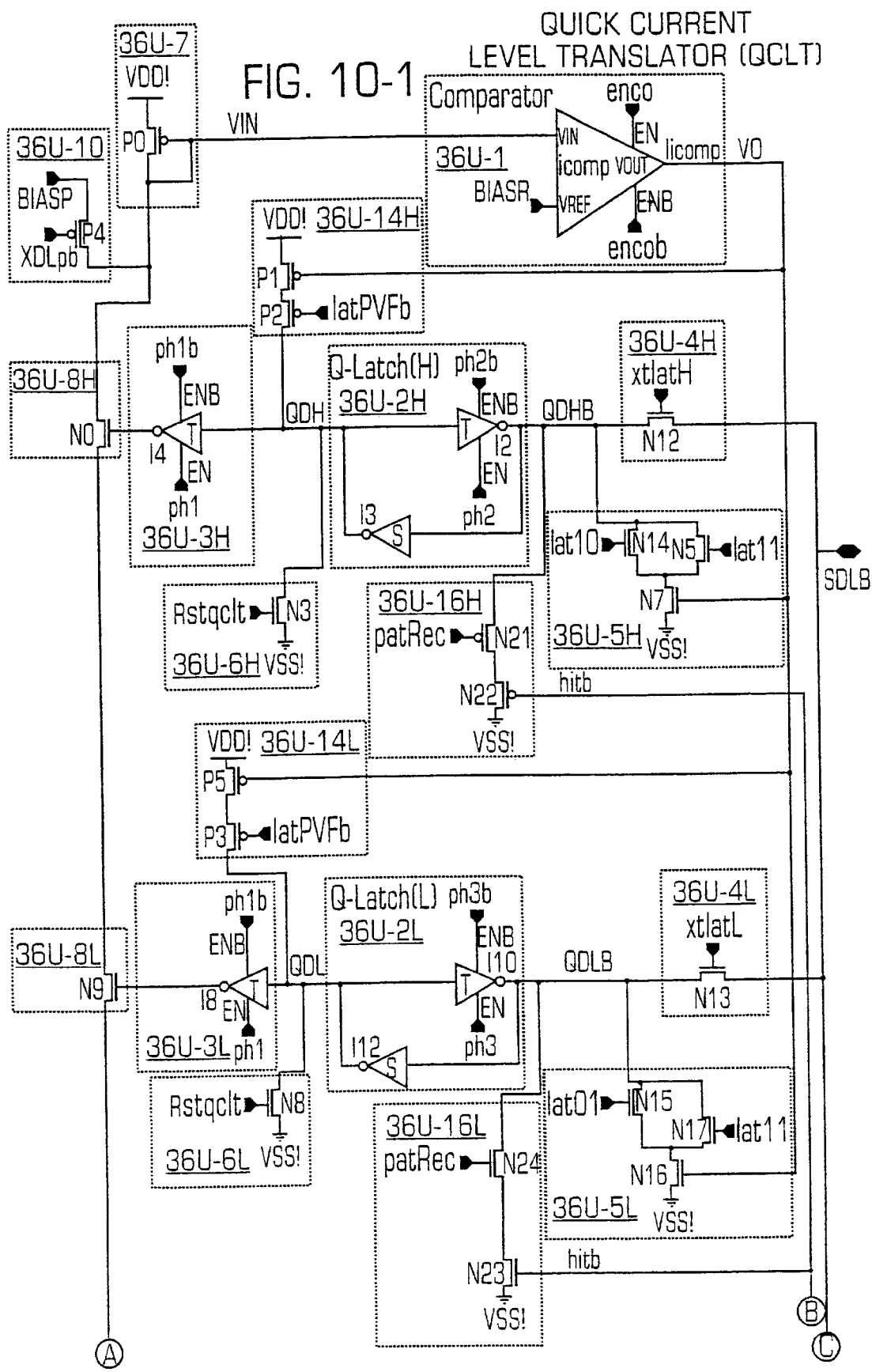
FIG. 10 is a schematic circuit diagram of the sensing circuit shown in FIG. 4 for multi-level operation.
Figures 2, 10:
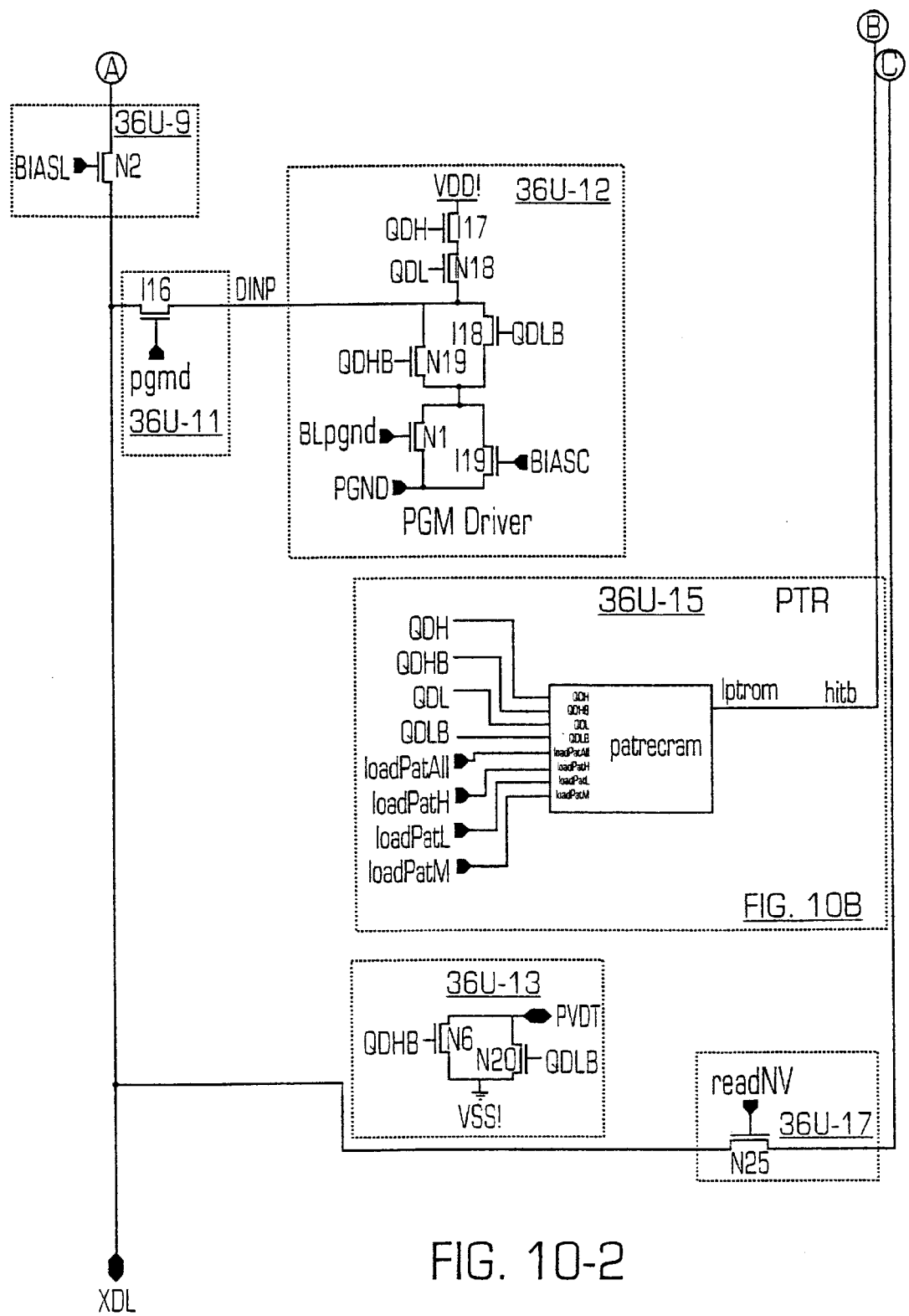

To read a multi-level cell, a multi-step sensing operation is adopted to detect and convert the threshold voltage level into a two-bit binary code. During the multi-step sensing, a multi-level voltage source is applied to CONG terminal. The variable voltage level applied to CONG is used as reference to detect the threshold voltage. The detecting algorithm is commonly known as "successive approach". At the beginning, CONG is set to VCR1 and sensing circuitry is turned on to detect whether the selected cell conducts current or not. If the cell conducts current, the threshold voltage belongs to group '11'. If the cell conducts no current, CONG will be set to VCR2 to sense a higher level. Step by step, CONG level is raised higher each time to sense higher threshold voltage level. Once the threshold voltage level of the selected cell is found, the corresponding binary codes will be assigned and stored FIG. 10 is a schematic view of a QCLT 36U modified from FIG. 4 for multi-level read/program operation. The basic structure is mostly identical to the embodiment shown in FIG. 4, except that the Q latch related circuitry 36U-2 is duplicated, shown as 36U-2H and 36U-2L, and pattern-recognition circuitry PTR 36U-15/36U-16H/36U-16L is added.

Figure 10A:
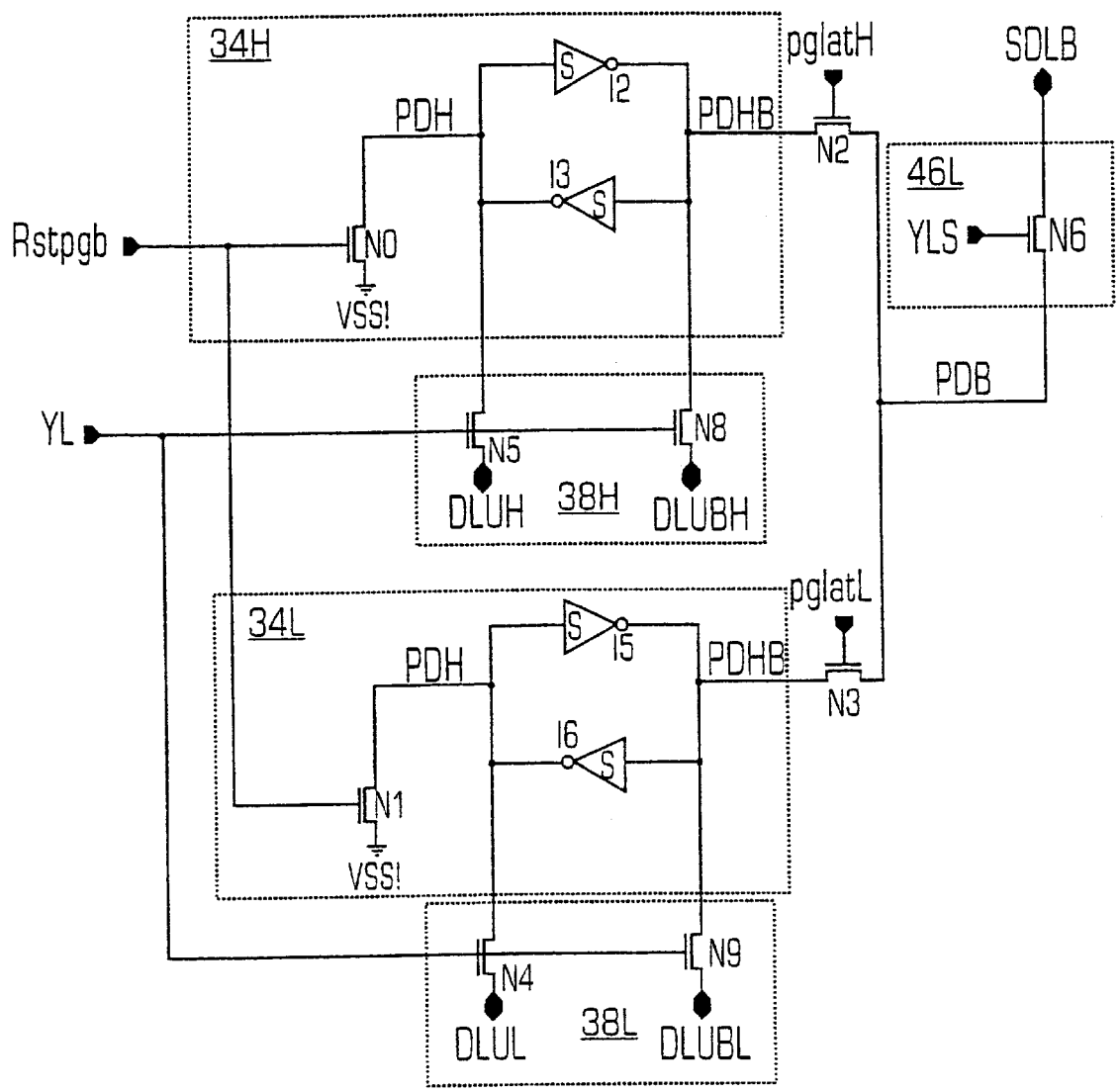
FIG. 10A is a detailed circuit diagram of one of the page buffers shown in FIG. 3 suitable for multi-level cells.

FIG. 10A shows the page latches 34 for multi-level operation.

FIG. 10B is a schematic circuit diagram of the pattern-recognition device PTR. The PTR circuit is used to selectively accept or reject some specific data paterns. The PTR circuit accepts only specific patterns of data loaded into Q latches 36U-2H/36U-2L before program iteration starts. If the data loaded into Q latches 36U-2H/36U-2L is not accepted by PTR, Q latches 36U-2H/36U-2L will be reset to "program inhibit" state. This pattern selection device could eliminate over-programming to those cells that need not to be programmed.

The program/read operation of this multi-level QCLT 36 is detailed below.

Refer to FIG. 10C~10F for detail timing diagram of cell current sensing.

The multi-level read operation is divided into 3 serial sections. In the first section, the inputs {QDH, QDL} of Q latches 36U are first reset to {0,0} state, respectively, by 36U-6H/36U-6L. CONG is connected to VCR1 output of the multi-level voltage source and the selected bit line is pre-charged to BIASL−VTN by 36U-10. PMOS transistor 36U-7 mirrors the cell current into the comparator 36U-1. If the threshold voltage of the selected cell is higher than VCR1, VO of the comparator 36U-1 stays at 0V. Otherwise, as shown in FIG. 10C, VO becomes VCC and the inputs {QDH, QDL} to Q Latches 36U-2H/36U-2L will be flipped to {1,1} state when signal lat11 (supplied to 36U-5H/36U-5L) is high. While lat11 is high, inverter 36U-3H/36U-L is tri-stated to avoid noise feeding back to the comparator 36U-1. Once the inputs {QDH, QDL} to Q Latches 36U-2H/36U-2L become {1,1} after sensing, pass gate transistor 36U-8H/36U-8L will be cut off and the comparator 36U-1 will be disconnected from the selected memory cell. By doing this, the selected cell will conduct no more current after sensing and the data {QDH, QDL} is frozen during the rest of the sensing operation.

In the second section, CONG is raised to VCR2 and the selected bit line is pre-charged. If threshold voltage of the selected cell is higher than VCR2, VO of the comparator 36U-1 stays at 0V. Otherwise, as depicted in FIG. 10D, VO becomes VCC and inputs {QDH, QDL} to Q Latches 36U-2H/36U-2L will be flipped to {1,0} state, respectively, when signal lat10 is high. Once inputs {QDH, QDL} become {1,0} after sensing, pass gate transistor 36U-8H will be cut off. The data {QDH, QDL} is frozen during the rest of sensing operation.

In the third section, CONG is raised to VCR3 and the selected bit line is pre-charged. If threshold voltage of the selected cell is higher than VCR3, VO of the comparator 36U-1 stays at 0V. Otherwise, as depicted in FIG. 1E, VO becomes VCC and {QDH, QDL} will be flipped to {0,1} state when signal lat01 is high. Once {QDH, QDL} becomes {0,1} after sensing, pass gate transistor 36U-8L will be cut off. The data {QDH, QDL} is frozen during the rest of sensing operation.

If the threshold voltage of the selected cell is higher than VCR3, {QDH, QDL} stays at {0,0} state as depicted in FIG. 10F.

Data {QDH, QDL} will be transferred to node {PDH, PDL} of page latches 34H/34L through local data line SDLB while signal xtlatH/xlatL and pglatH/pglatL become high.

For programming a cell to multi-levels, refer to FIG. 10G~10I for detail program timing diagram.

Before starting the program operation, all the page latches 34 are reset by signal Rstpgb. Then data to be programmed are loaded from IO pads to the selected page latches 34 through the third column decoder 38/40/42. Since node SDLB of each QCLT 36U is connected to a plurality of page latches, only one {PDH, PDL} pair of those page latch data can be uploaded to {QDH, QDL} for programming during one program iteration. To upload the selected {PDH, PDL}, pglatH/pglatL and xtlatH/xlatL are switched to high and Q latches 36U-2H/36U-2L are tri-stated by switching ph2/ph3 to low (ph2b/ph3b to high).

After {QDH, QDL} is loaded, PTR 36U-15 is activated to check the data pattern of {QDH, QDL} by properly switching signal loadPatL, loadPatM, loadPatH and patRec. Different {QDH, QDL} patterns represent different threshold voltage levels to which the cells are about to be programmed. The multi-level program algorithm of the present invention will selectively accept specific {QDH, QDL} patterns according the target threshold voltage level. If the {QDH, QDL} pattern is not accepted by PTR, {QDH, QDL} will be set to "program inhibit" state ("11" state) by 36U-16H/36U-16L. For instance, as depicted in FIG. 10G, the target threshold voltage level is "10". Data pattern "10", "01", "00" will be accepted and data pattern "11" is "program inhibit" state. In FIG. 10H, the target level is "01". Data pattern "01" and "00" are accepted. Pattern "10" is rejected because level 10 is lower than the target level and should not be over-programmed to level "01". In FIG. 10I, the target level is "00", Data pattern "01", "10" will be rejected to prevent over-programming to level "00".

Figure 10J:
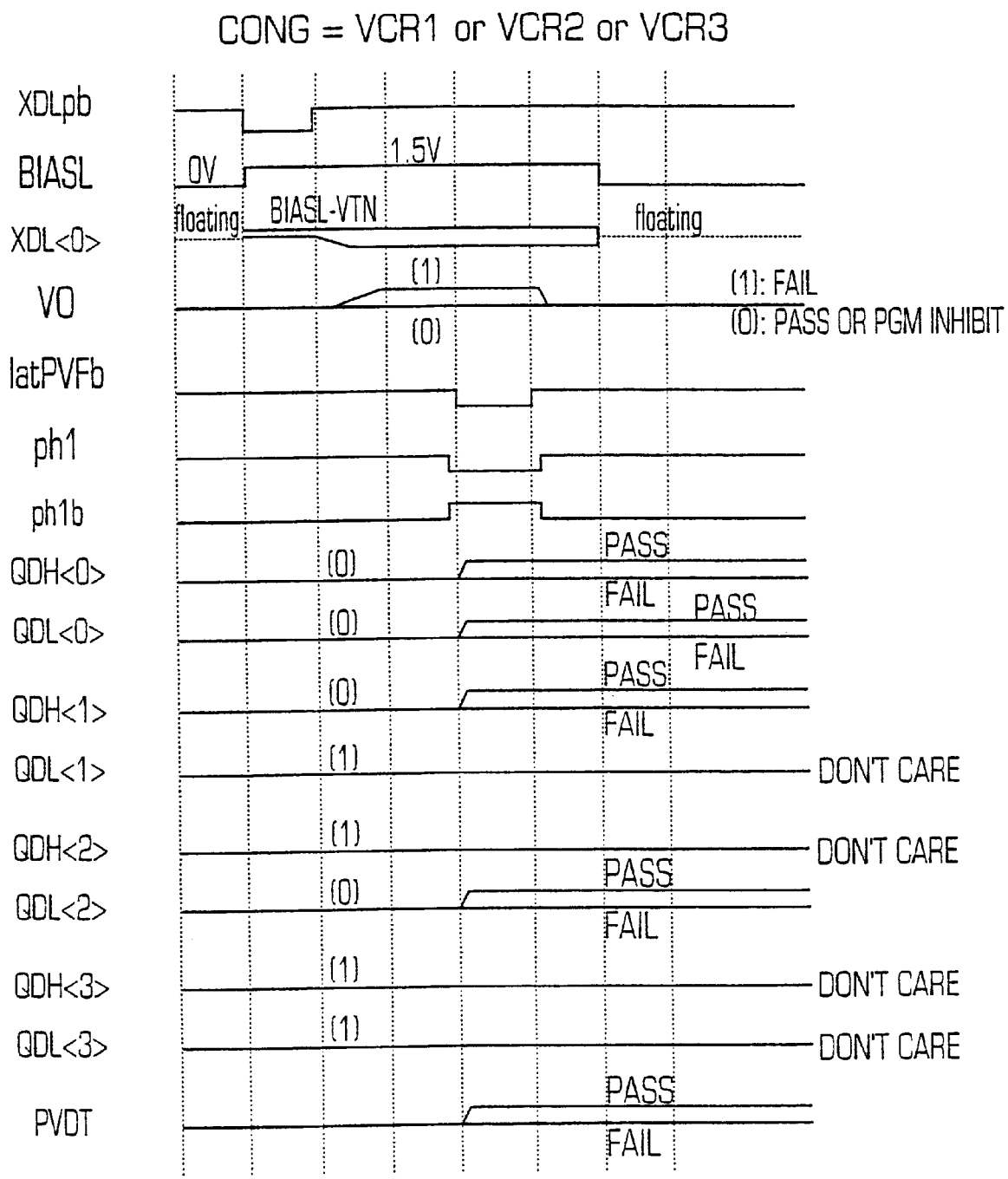
FIG. 10J is a timing diagram showing page-mode program verification operation for a multi-level cell for the device of the present invention.

Next, signal pgmd turns on the pass gate transistor 36U-11 that connects the programming circuit 36U-12 to local data line XDL. XDL is connected to the selected bit line through the first column decoder 46U. Depending the {QDH, QDL} data stored in Q latches, the selected bit line will be driven to either VCC−VTN or 0V. If the selected cell is about to be programmed to higher threshold voltage than its original value, its bit line will be pulled down to 0V. If the threshold voltage of the selected cell is not to be modified, its bit line will be pulled up to VCC−VTN. FIG. 10J is a timing diagram of multi-level program verification.

Figure 10K:
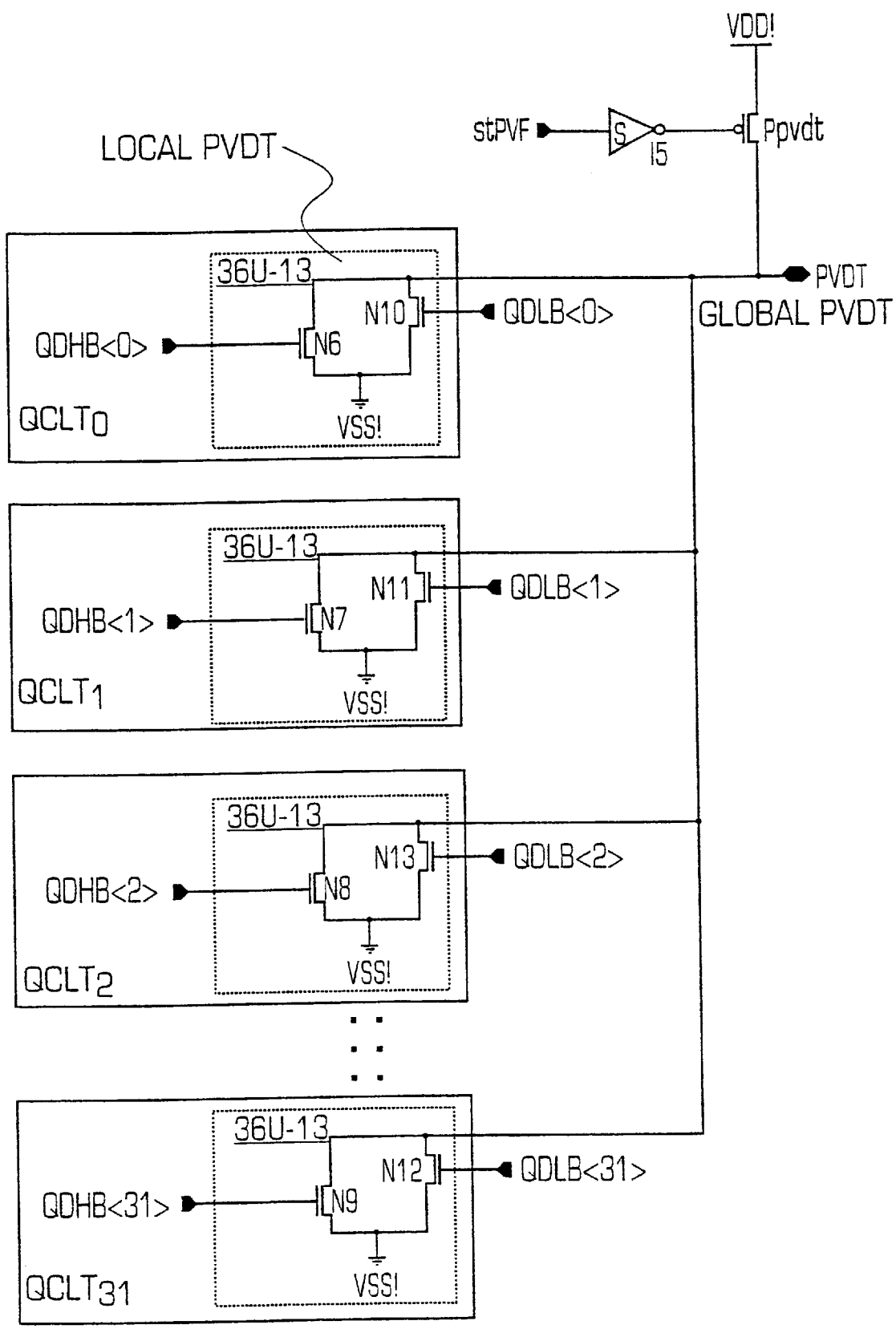
FIG. 10K is a detailed circuit diagram of a portion of the circuit shown in FIG. 10 for page-mode program verification for multi-level cells.

The program verification operation is similar to the current sensing operation depicted in FIG. 10C except that data {QDH, QDL} is modified in a different way. CONG is set to one of VCR1, VCR2 or VCR3 according the target threshold voltage level. {QDH, QDL} will be flipped to "program inhibit" state ("11" state) if the selected cell conducts no current. If the selected cell is successfully programmed, its threshold voltage will be higher than the target level and will conduct no more current under verification condition. Once this no-current state is reached, {QDH, QDL} will be flipped to "11" and its corresponding bit line will be pulled up to VCC−VTN ("program inhibit" state). Each QDHB/QDLB is wired-NOR to PVDT. If all QDH/QDL become high, PVDT will also become high. By checking PVDT, program iterations can be determined to be "PASS" or "FAIL". FIG. 10K shows how the QDHB/QDLB nodes are wired to form a NOR logic.

Figures 1, 11:
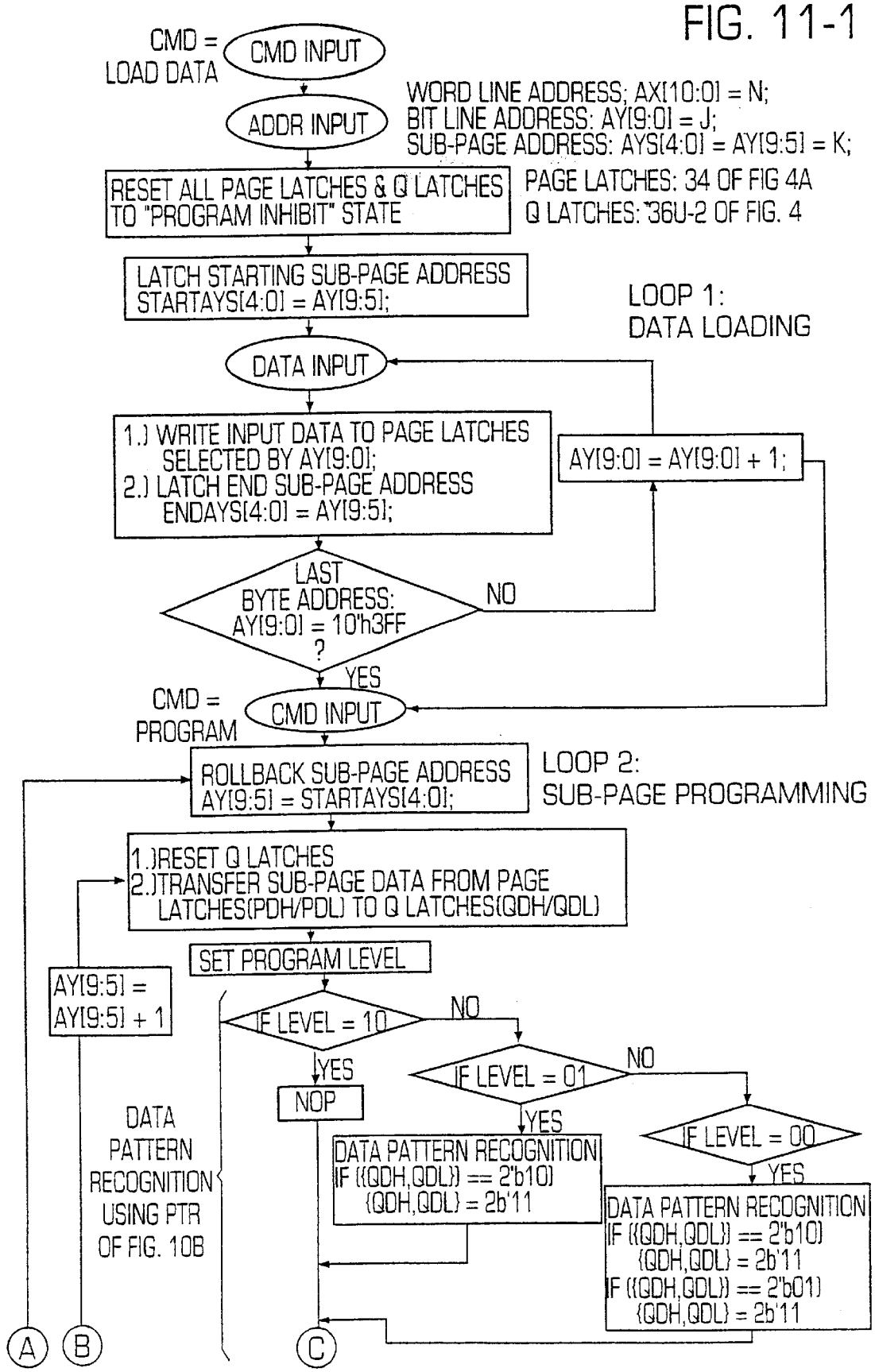
FIG. 11 is a flow chart showing the method to program a sub-page of cells to multi-levels.
Figures 2, 11:
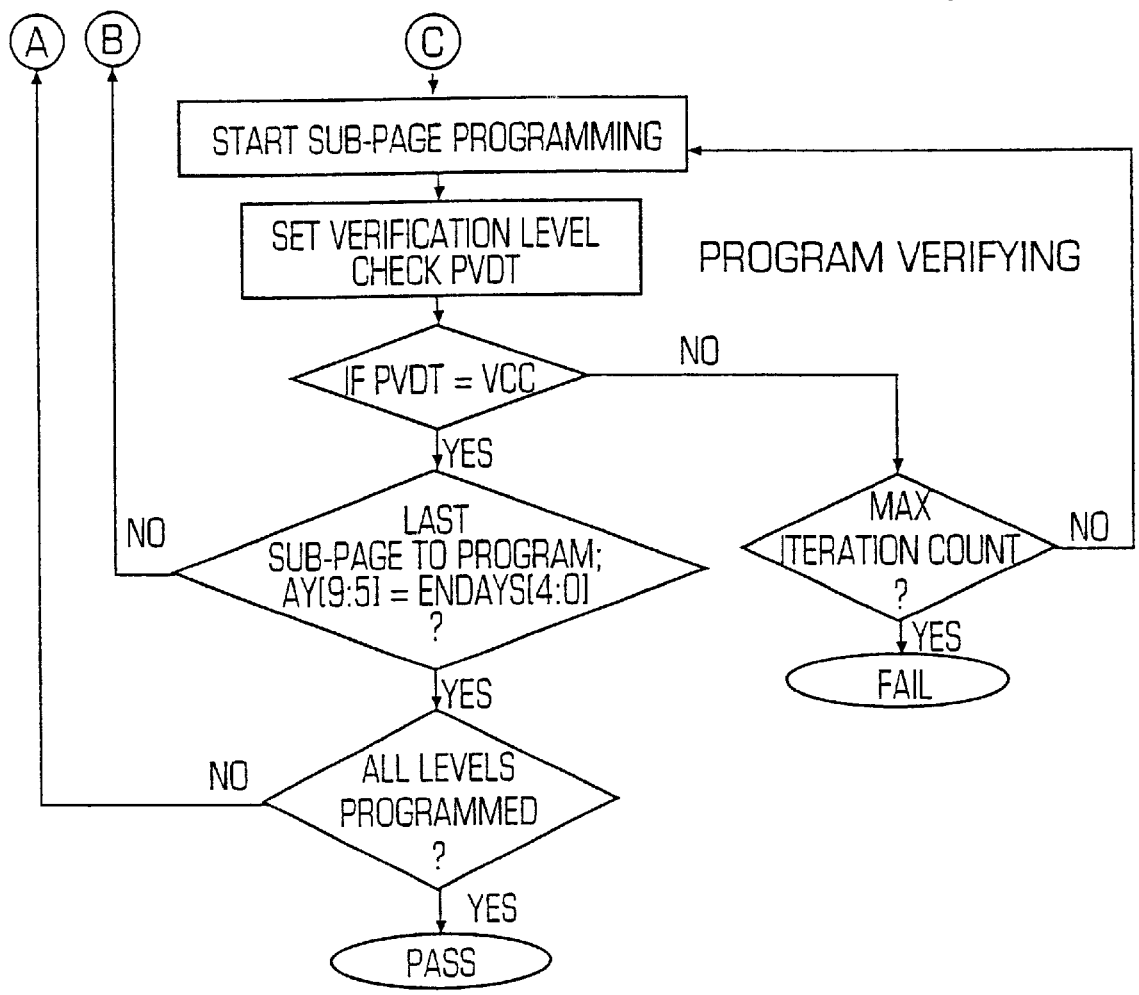

FIG. 11 is a flow chart for performing the multi-level page-mode program operation. This flow chart is mostly identical to FIG. 8 except that an extra section of data pattern recognition algorithm is added to eliminate over-programming (refer to PTR FIG. 10B).

Figures 1, 11A:
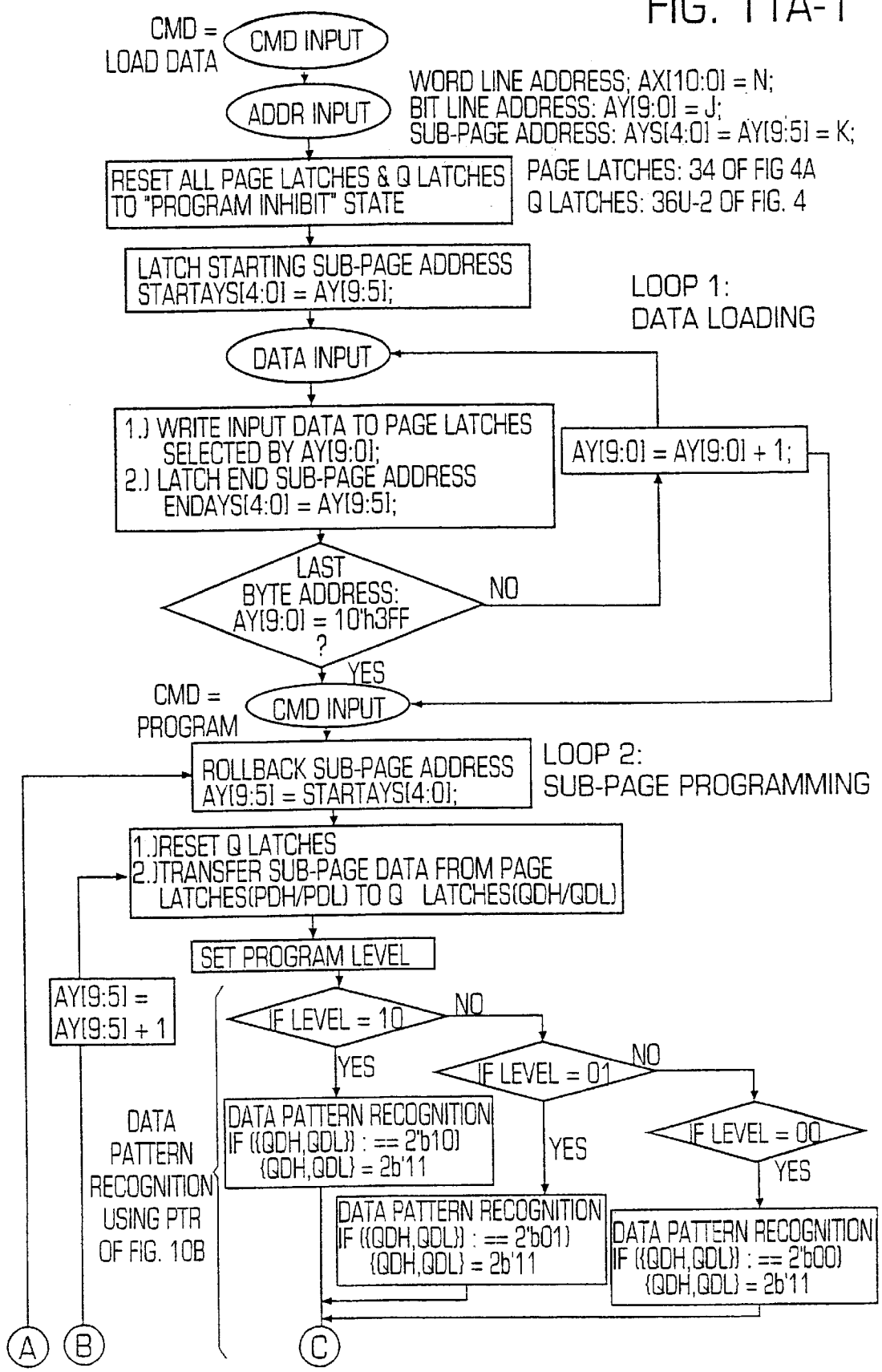
FIG. 11A is another flow chart showing the method to program a sub-page of cells to multi-levels.
Figures 2, 11A:
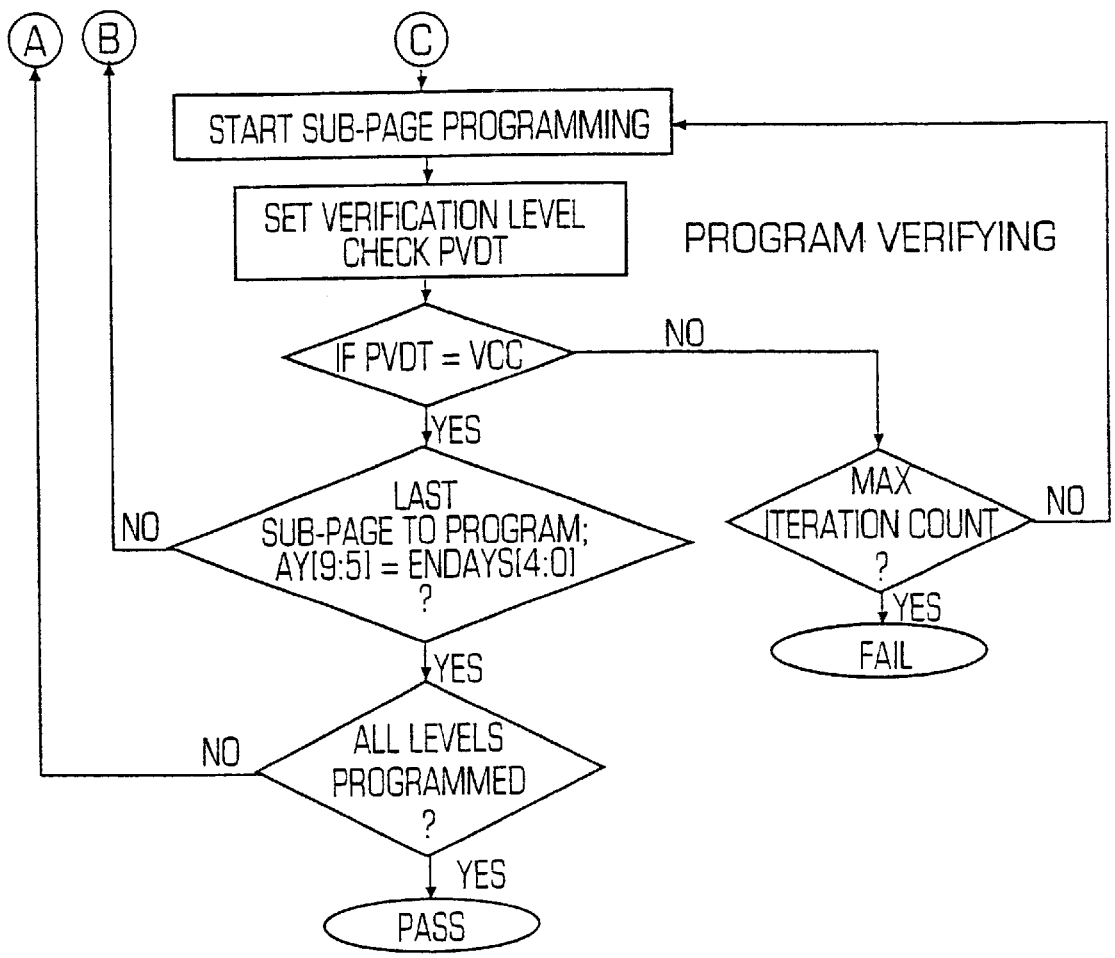

FIG. 11A is another flow chart modified from FIG. 11. In this chart, the data pattern recognition algorithm is changed and new PTR depicted in FIG. 11B is used to replace PTR of FIG. 10B. In this new algorithm, only one specific pattern is accepted for each target threshold voltage level. For instance, if the target level is "10", only pattern "10" will be accepted and all the other patterns will be rejected (flipped to "program inhibit" state).

Referring to FIG. 10B there is shown one embodiment of the PTR 36U-15. The signal loadPatAll is supplied to the gate of transistor 80. Transistor 80 connects the output signal hitb to node 98. At node 98 there are 6 parallel branch paths: designated as a, b, c, d, e and f. The signal loadPatL is supplied to the gate of transistors 82a, 82b, and 82c. The signal loadPatM is supplied to the gate of transistors 84d and 84e. The signal loadPatH is supplied to the gate of transistor 86f. The data signal QDH is supplied to the gate of transistor 88c. The inverse of the signal QDH, QDHB is supplied to the gate of transistors 90a, 90b, 90d, 90e and 90f. The signal QDL is supplied to the gate of transistor 92b and 92e. The inverse of the signal QDL, QDLB is supplied to the gate of transistors 94a, 94c, 94d, and 94f. As can be seen from FIG. 10B, all the transistors in the same current path (a, b, c, d, e, or f) are connected in series. Thus, transistors 82a, 90a and 94a are connected in series. Similarly, transistors 82b, 90b, and 92b are connected in series. Although there is shown in FIG. 10B the designations "00","01", and "10". It should be noted that these are not inputs. Rather they are comments showing when the states of {QDH, QDL} connect hitb to ground, as explained hereinbelow.

In FIG. 10B, when loadPatAll=1, then transistor 80 connects hitb to node 98. Further if loadPatL=1, and if QDHB="1" and QDLB="1", then hitb will be connected to Vss through transistors 82a, 90a, and 94a. When QDHB="1" and QDLB="1", then this means that the inverse of the signals or QDH and QDL are both "0". Thus hitb is connected to ground when {QDH, QDL} are in the state of {0,0}. Similarly, if loadPatL=1, and {QDH, QDL} are in the state of {0,1}, then hitb is connected to ground through transistors 82b, 90b, and 92b. If loadPatL=1, and {QDH, QDL} are in the state of {1,0}, then hitb is connected to ground through transistors 82c, 88c, and 94c. The other three conditions when hitb is connected to ground occurs when loadPatM=1, and {QDH, QDL} are in the states of {0,0}; or when loadPatM=1, and {QDH, QDL} are in the states of {0,1}; or when loadPatH=1, and {QDH, QDL} are in the states of {0,0}. Once hitb=0, the data of {QDH,QDL} is accepted and will be programmed into memory cells.

In contrast in FIG. 11B, when loadPatAll=1, and loadPatL=1, if the states of {QDH,QDL} are "10", hitb will become 0. When loadPatAll=1, loadPatM=1, if the states of {QDH,QDL} are "01", hitb will become 0.

Finally, when loadPatAll=1, and loadPatH=1, if the states of {QDH,QDL} are "00", hitb will become 0. Once hitb=0, the data of {QDH,QDL} is accepted and will be programmed into memory cells.

With reference to the algorithm of programming shown in FIG. 11, the PTR of FIG. 10B is adopted. When program level="10", loadPatAll=1 and loadPatL=1, hitb will be 0 if {QDH, QDL} equal to any one of "00","01", or "10". Cells which are going to be programmed to three different levels "00","01","10" are first programmed to level "01" as shown in FIG. 10G. When program level="01", loadPatAll=1, and loadPatM=1, hitb will be 0 if {QDH,QDL} equal to either one of "00" or "01". If {QDH,QDL}="10", hitb will be 1 and {QDH,QDL} will be flipped to "11". Cells which are going to be programmed to two different level "00" or "01" are then programmed to level "01" as shown in FIG. 10H. When program level="00", loadPatAll=1 and loadPatH=1, hitb will be 0 if {QDH,QDL} equal to "00". If {QDH, QDL}="01" or "10", hitb will be 1 and {QDH,QDL} will be flipped to "11". Cells which are going to be programmed to level "00" are then programmed to level "00" as shown in FIG. 10I. In this algorithm, cells which are to be programmed to different levels ("00","01 ","10") are programmed in such a manner that all those cells are first programmed to the lowest level (in this case "10") regardless of their individual target level. Then, in the following program interval, cells are programmed to the middle level ("01"). During this program interval, cells targeted for level "10" will be selectively rejected by PTR device (when hitb=1). Only cells with target level "00" and "01" will be programmed to level "01". Similarly, in the final program interval, Only cells targeted for level "00" will be programmed to level "00", while cells targeted for level "10" and "01" will be selectively rejected.

The programming algorithm of FIG. 11A differs from that shown in FIG. 11 only in the PTR device portion and the method of operation based upon this difference. In the programming algorithm shown in FIG. 11A, the PTR of FIG. 11B is adopted. When program level="10", loadPatAll=1 and loadPatL=1, hitb will be 0 only if {QDH, QDL} equal to "10". Cells which are going to be programmed to level "10" are programmed to level "01". When program level="01", loadPatAll=1, and loadPatM=1, hitb will be 0 only if {QDH,QDL} equal to "01". Cells which are going to be programmed to level "01" are then programmed to level "01". When program level="00", loadPatAll=1 and loadPatH=1, hitb will be 0 only if {QDH,QDL} equal to "00". Cells which are going to be programmed to level "00" are then programmed to level "00". In this algorithm, cells which are to be programmed to different levels ("00","01", "10") are programmed in such a manner that cells of the same target level are programmed to their individual target level in one program interval. During program interval for level "10", level "00" and "01" will be rejected (hitb=1). During program interval for level "01", level "00" and "10" will be rejected. During program interval for level "00", level "01" and "10" will be rejected.

What is claimed:

1. An integrated circuit memory device comprising:
    an array of floating gate memory cells electrically coupled to a respective plurality of word lines and a plurality of bit lines; said array arranged in a plurality of sub-pages of memory cells, each memory cell for storing a plurality of states represented by a plurality of bits;

a plurality of sub-page buffers electrically coupled to said plurality of bit lines for storing data, externally supplied to said device, and to be programmed into said memory cells coupled to said plurality of bit lines;

a programming control circuit, including a pattern recognition circuit, coupled to said plurality of sub-page buffers for initiating a programming operation to program data sequentially from one sub-page buffer into an associated sub-page of memory cells and for controlling the programming of each memory cell, from state to another, until data from said plurality of sub-page buffers are programmed into said plurality of sub-page memory cells.

2. The memory device of claims 1 wherein each sub-page further comprises a plurality of non- adjacent evenly spaced apart bit lines with memory cells coupled thereto.

3. The memory device of claim 2 wherein each sub-page buffer is associated with a plurality of adjacent bit lines; and a column selection circuit for selecting a sub-page buffer to one of said plurality of adjacent bit lines.

4. The memory device of claim 1 wherein the pattern recognition circuit comprises:

a combinatorial logic circuit for determining when the plurality of states of each memory cell are reached and for inhibiting the programming of said memory cell to a different state.

5. A method of programming a non-volatile memory device, said non-volatile memory device having an array of non-volatile floating gate memory cells electrically coupled to a respective plurality of word lines and a plurality of bit lines; said array arranged in a plurality of sub-pages of memory cells, said method comprising:

programming a sub page of memory cells at a time, wherein within each sub page of memory cells, data is sequentially programmed to a plurality of memory cells coupled to a plurality of non-adjacent evenly spaced apart bit lines;

sequentially programming each memory cell in a sub-page by programming the cell from one state to another; and verifying the programming after each state of a memory cell to ensure that the cell is programmed.

6. The method of claim 5 wherein said programming step programs all of the cells to a first state irrespective of the desired state.

7. The method of claim 6 wherein said progamming step further comprises incrementally programming certain cells to a second state, wherein said certain cells constitute all of the cells having a desired state other than said first state.

8. The method of claim 5 wherein said programming step programs only cells of to their desired state, without programming other cells.

* * * * *